(12) United States Patent
Maruyama et al.

(10) Patent No.: US 8,536,005 B2
(45) Date of Patent: Sep. 17, 2013

(54) SEMICONDUCTOR INTEGRATED CIRCUIT DEVICE AND MANUFACTURING METHOD THEREOF

(75) Inventors: Takahiro Maruyama, Kanagawa (JP); Masao Inoue, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 168 days.

(21) Appl. No.: 13/198,703

(22) Filed: Aug. 4, 2011

(65) Prior Publication Data
US 2012/0049288 A1 Mar. 1, 2012

(30) Foreign Application Priority Data
Aug. 25, 2010 (JP) .................................. 2010-188151

(51) Int. Cl.
*H01L 21/8238* (2006.01)
(52) U.S. Cl.
USPC .... 438/216; 438/287; 438/592; 257/E21.635; 257/E21.639
(58) Field of Classification Search
USPC .......................... 438/199–233, 287, 591, 592; 257/E21.632–E21.643
See application file for complete search history.

(56) References Cited

U.S. PATENT DOCUMENTS

| | | | | |
|---|---|---|---|---|
| 6,815,285 B2* | 11/2004 | Choi et al. | ..................... | 438/231 |
| 7,585,756 B2* | 9/2009 | Nam et al. | ..................... | 438/592 |
| 7,741,201 B2 | 6/2010 | Yugami et al. | | |
| 8,034,678 B2* | 10/2011 | Kobayashi | ..................... | 438/199 |
| 8,293,632 B2* | 10/2012 | Kadoshima et al. | .......... | 438/585 |
| 8,343,839 B2* | 1/2013 | Ando et al. | ..................... | 438/283 |
| 2006/0011949 A1* | 1/2006 | Yang et al. | ..................... | 257/204 |

FOREIGN PATENT DOCUMENTS
JP 2006-245306 9/2006
JP 2006-269520 A 10/2006

* cited by examiner

*Primary Examiner* — Asok K Sarkar
*Assistant Examiner* — Eric Ward
(74) *Attorney, Agent, or Firm* — Miles & Stockbridge P.C.

(57) ABSTRACT

Various methods are proposed for forming a gate insulation film, a metal gate layer, and others separately in an N-channel region and a P-channel region of an integrated circuit device having a CMIS or CMOS structure using a metal gate. One of the problems of the methods however has been that the process becomes complex. The present invention is that, in a manufacturing method of a CMOS integrated circuit device, a titanium-based nitride film for adjusting the electrical properties of a high-permittivity gate insulation film before a gate electrode film is formed includes a lower film containing a comparatively large quantity of titanium and an upper film containing a comparatively large quantity of nitrogen in an N-channel region and a P-channel region.

16 Claims, 26 Drawing Sheets

SEMICONDUCTOR INTEGRATED CIRCUIT DEVICE AND MANUFACTURING METHOD THEREOF

CROSS-REFERENCE TO RELATED APPLICATIONS

The disclosure of Japanese Patent Application No. 2010-188151 filed on Aug. 25, 2010 including the specification, drawings and abstract is incorporated herein by reference in its entirety.

FIELD OF THE INVENTION

The present invention relates to a technology effectively applied to a gate stack technology in a semiconductor integrated circuit device (or a semiconductor device) and a manufacturing method of the semiconductor integrated circuit device (or the semiconductor device).

BACKGROUND

Japanese Unexamined Patent Publication No. 2006-269520 (Patent literature 1) or United States Patent No. 7741201 (Patent literature 2) corresponding to it discloses a gate stack structure formed by interposing a titanium film as a buffer layer between a high-k gate insulation film and a titanium nitride gate electrode.

Japanese Unexamined Patent Publication No. 2006-245306 (Patent literature 3) discloses a technology that makes it possible to reduce damages to a gate insulation film and obtain a gate electrode having an appropriate work function by forming a titanium nitride gate electrode by CVD (Chemical Vapor Deposition) at 450° C. or lower.

RELATED TECHNICAL LITERATURE

[Patent Literature]
[Patent Literature 1]
  Japanese Unexamined Patent Publication No. 2006-269520
[Patent Literature 2]
  U.S. Pat. No. 7,741,201
[Patent Literature 3]
  Japanese Unexamined Patent Publication No 2006-245306

SUMMARY

Various methods are proposed for forming a gate insulation film, a metal gate layer, and others separately in an N-channel region and a P-channel region of an integrated circuit device having a CMIS (Complementary Metal Insulator Semiconductor) or CMOS (Complementary Metal Oxide Semiconductor) structure using a metal gate. One of the problems of the methods however has been that the process becomes complex.

The present applied invention has been established in order to solve the problems.

An object of the present invention is to provide: a comparatively simple manufacturing process of a semiconductor integrated circuit device; and a semiconductor integrated circuit device.

The above and further objects and novel features of the present invention will appear from the description and the accompanying drawings in the present specification.

The outline of a representative example of the invention disclosed in the present application is briefly explained as follows.

That is, an example of the invention in the present application is that, in a manufacturing method of a CMOS integrated circuit device, a titanium-based nitride film for adjusting the electrical properties of a high-permittivity gate insulation film before a gate electrode film is formed includes a lower film containing a comparatively large quantity of titanium and an upper film containing a comparatively large quantity of nitrogen in an N-channel region and a P-channel region.

The effect obtained by a representative example of the invention disclosed in the present application is briefly explained as follows.

That is, in a manufacturing method of a CMOS integrated circuit device, it is possible to effectively control the threshold voltage of a P-channel MISFET (Metal Insulator Semiconductor Field Effect Transistor) through a comparatively simple process by structuring a titanium-based nitride film for adjusting the electrical properties of a high-permittivity gate insulation film before a gate electrode film is formed so as to include a lower film containing a comparatively large quantity of titanium and an upper film containing a comparatively large quantity of nitrogen in an N-channel region and a P-channel region.

DETAILED DESCRIPTION

Figure 1:
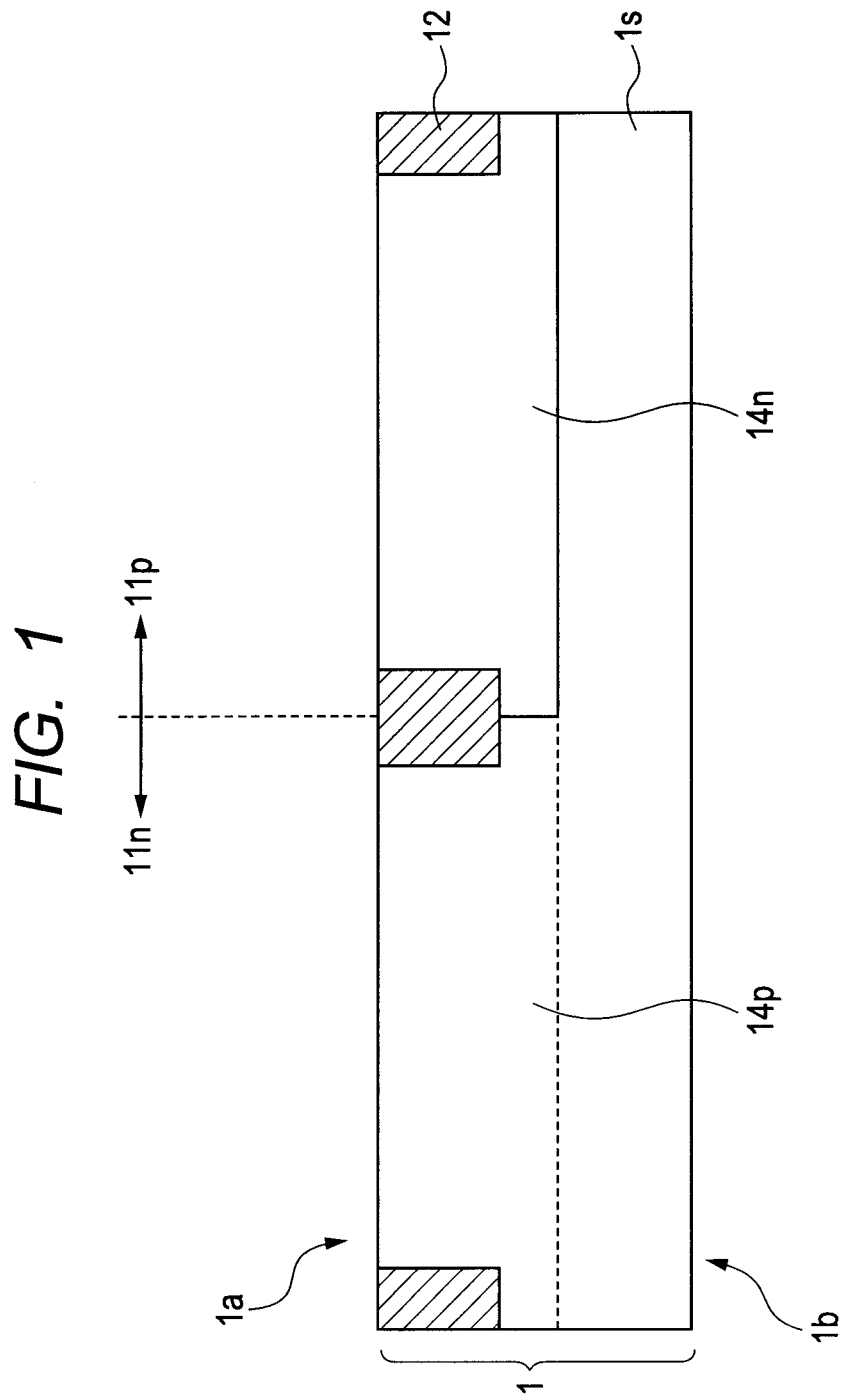
FIG. 1 is a sectional view of a device in a wafer process in a manufacturing method (a double metal masking method) of a semiconductor integrated circuit device according to First Embodiment (basic example) of the present application (a step of introducing a well).

Firstly, the outline of representative embodiments according to the invention disclosed in the present application is explained.

1. A method for manufacturing a semiconductor integrated circuit device includes the steps of (a) forming high-permittivity insulation film in an N-channel region and a P-channel region over a first main surface of a semiconductor wafer, (b) forming a P-channel capping film over the high-permittivity insulation film, (c) forming a high-melting point metal nitride masking film over the P-channel capping film, (d) removing the P-channel capping film and the high-melting point metal nitride masking film in the N-channel region, (e) covering the N-channel region and the P-channel region with an N-channel capping film after the step (d), (f) applying annealing treatment to the side of the first main surface of the semiconductor wafer after the step (e), (g) removing the high-melting point metal nitride masking film, the N-channel capping film, and the P-channel capping film after the step (f), (h) forming a gate electrode film over the high-permittivity insulation film after the step (g), and (i) forming a gate electrode in each of the N-channel region and the P-channel region by patterning the gate electrode film. In the case, the high-melting point metal nitride masking film includes (x1) a lower layer high-melting point metal nitride masking film having a first element composition ratio and (x2) an upper layer high-melting point metal nitride masking film having a second element composition ratio in which nitrogen is richer than in the first element composition ratio and being formed over the lower layer high-melting point metal nitride masking film.

2. In a method for manufacturing a semiconductor integrated circuit device according to the item 1, the high-melting point metal nitride masking film has a titanium-based nitride film as the main constituent component.

3. In a method for manufacturing a semiconductor integrated circuit device according to the item 1 or 2, the high-permittivity insulation film has a hafnium-oxide-based insulation film as the main constituent component.

4. In a method for manufacturing a semiconductor integrated circuit device according to any one of the items 1 to 3, the P-channel capping film has an aluminum-based film as the main constituent component.

5. In a method for manufacturing a semiconductor integrated circuit device according to any one of the items 1 to 4, the N-channel capping film has a lanthanum-oxide-based insulation film as the main constituent component.

6. In a method for manufacturing a semiconductor integrated circuit device according to the item 5, through the step (f): the hafnium-oxide-based insulation film is modified to a film containing lanthanum in the N-channel region; and the hafnium-oxide-based insulation film is modified to a film containing aluminum and titanium in the P-channel region.

7. In a method for manufacturing a semiconductor integrated circuit device according to any one of the items 1 to 6: the lower layer high-melting point metal nitride masking film and the upper layer high-melting point metal nitride masking film are a titanium nitride film; and (1) the first element composition ratio (Ti/N) is 0.87 or more and 0.9 or less and (2) the second element composition ratio (Ti/N) is 0.77 or more and 0.84 or less.

8. In a method for manufacturing a semiconductor integrated circuit device according to any one of the items 1 to 7, the gate electrode film has (y1) a metal gate electrode film having a titanium-based nitride film as the main constituent component and (y2) a polysilicon gate electrode film having a polysilicon film formed over the metal gate electrode film as the main constituent component.

9. In a method for manufacturing a semiconductor integrated circuit device according to the item 8, the metal gate electrode film is a titanium nitride film and the element composition ratio (Ti/N) thereof is smaller than the first element composition ratio (Ti/N).

10. In a method for manufacturing a semiconductor integrated circuit device according to the item 8, the metal gate electrode film is a titanium nitride film and the element composition ratio (Ti/N) of the metal gate electrode film is smaller than the first element composition ratio (Ti/N) and larger than the second element composition ratio (Ti/N).

11. In a method for manufacturing a semiconductor integrated circuit device according to the item 10, the element composition ratio (Ti/N) of the metal gate electrode film is larger than 0.84 and smaller than 0.87.

12. In a method for manufacturing a semiconductor integrated circuit device according to any one of the items 8 to 11, the metal gate electrode film has (y11) a lower layer metal gate electrode film and (y12) an upper layer metal gate electrode film being formed over the lower layer metal gate electrode film and containing nitrogen more abundantly than the lower layer metal gate electrode film.

13. In a method for manufacturing a semiconductor integrated circuit device according to any one of the items 1 to 12, the step (c) is carried out by in-situ treatment.

14. In a method for manufacturing a semiconductor integrated circuit device according to any one of the items 1 to 13, the P-channel capping film and the high-melting point metal nitride masking film are removed by wet treatment in the step (d).

15. In a method for manufacturing a semiconductor integrated circuit device according to any one of the items 1 to 14, the P-channel capping film and the high-melting point metal nitride masking film are removed by wet treatment in the step (g).

16. In a method for manufacturing a semiconductor integrated circuit device according to the item 14 or 15, the wet treatment is applied with an HPM based etching liquid or an SPM based etching liquid.

17. A semiconductor integrated circuit device including (a) a semiconductor substrate having a first main surface and a second main surface, (b) an N-channel region and a P-channel region formed over the first main surface, (c) a P-channel MISFET formed in the P-channel region, and (d) an N-channel MISFET formed in the N-channel region. In the case: the P-channel MISFET includes (c1) a high-permittivity gate insulation film formed over the first main surface, (c2) a metal gate electrode film formed over the high-permittivity gate insulation film, and (c3) a polysilicon gate electrode film formed over the metal gate electrode film; and further the metal gate electrode film includes (c21) a lower layer metal gate electrode film and (c22) an upper layer metal gate electrode film being formed over the metal gate electrode film and containing nitrogen more abundantly than the metal gate electrode film.

18. In a semiconductor integrated circuit device according to the item 17, the high-permittivity gate insulation film is a hafnium-oxide-based insulation film and the metal gate electrode film is a titanium-based nitride film.

19. In a semiconductor integrated circuit device according to the item 17 or 18: the element composition ratio (Ti/N) of the lower layer metal gate electrode film is 0.87 or more and 0.9 or less; and the element composition ratio (Ti/N) of the upper layer metal gate electrode film is 0.77 or more and 0.84 or less.

Explanations of Description Forms, Basic Terms, and Usage in the Present Application 1. In the present application, the descriptions of embodiments are neither independent nor separate from each other and one of the parts of a single case is a detail of another part thereof or a modified case of a part or the whole part thereof unless otherwise particularly specified even though there are some cases where the descriptions are divided into plural sections for convenience sake if necessary. Further, repetitions of similar parts are omitted in principle. Furthermore, constituent components in embodiments are not essential except when it is particularly specified otherwise, when the number is limited theoretically, or when it is obviously otherwise from context.

Moreover, in the present application, when the term "a semiconductor device" or "a semiconductor integrated circuit device" is cited, the term mostly means a device formed by integrating various transistor single bodies (active elements) and resistances, condensers, and others around them over a semiconductor chip (for example, a monocrystal silicon substrate) or the like. Here, a representative example of such various transistors can be a MISFET (Metal Insulator Semiconductor Field Effect Transistor) represented by a MOSFET (Metal Oxide Semiconductor Field Effect Transistor). In this case, a representative example of an integrated circuit structure can be a CMIS (Complementary Metal Insulator Semiconductor) based integrated circuit represented by a CMOS (Complementary Metal Oxide Semiconductor) based integrated circuit formed by combining an N-channel MISFET with a P-channel MISFET.

A today's wafer step of a semiconductor integrated circuit device, namely an LSI (Large Scale Integration), is generally divided broadly into: an FEOL (Front End of Line) step ranging from carry-in of a silicon wafer as a primary material to the vicinity of a pre-metal step (a step including the steps of forming an interlayer insulation film between the bottom end of an M1 wiring layer and a gate electrode structure and the like, forming a contact hole, tungsten plugging, embedding, and others); and a BEOL (Back End of Line) step beginning from the step of forming the M1 wiring layer and reaching the vicinity of the step of forming a pad aperture in a final passivation film over an aluminum based pad electrode (in a wafer level package process, the process is included). In the FEOL step, a gate electrode patterning step, a contact hole forming step, and the like are microfabrication steps requiring particularly fine processing. Meanwhile, in the BEOL step, microfabrication is particularly required at a via and trench forming step, in particular at a comparatively lower layer local wiring (for example, a fine embedded wiring ranging roughly from M1 to M3 in the case of embedded wiring of about four-layered structure and roughly from M1 to M5 in the case of embedded wiring of about ten-layered structure) or the like. Here, the term "MN (usually N=1 to about 15)" represents the wiring of N-th from the bottom. M1 represents a first layer wiring and M3 represents a third layer wiring.

2. In the descriptions of embodiments and others on materials and compositions likewise, even in the case of the description of "X including A" or the like, it does not exclude the case where a component other than A is included as one of the main constituent components except when it is particularly specified otherwise or when it is obviously otherwise from context. For example, with regard to a component, the description means "X including A as a main component" or the like. Further for example, it goes without saying that the description of "a silicon member" or the like: does not mean that the silicon member is limited to pure silicon; but means that the silicon member includes a member including an SiGe alloy, another multiple alloy containing silicon as a main component, another additive, and the like. Likewise, it goes without saying that the descriptions of "a silicon oxide film", "a silicon-oxide-based insulation film", and the like include not only a comparatively pure undoped silicon dioxide but also a composite film or the like with a thermally-oxidized film such as FSG (Fluorosilicate Glass), TEOS-based silicon oxide, SiOC (Silicon Oxicarbide), carbon-doped silicon oxide, OSG (Organosilicate Glass), PSG (Phosphorus Silicate Glass), or BPSG (Borophosphosilicate Glass), a CVD oxide film, coating based silicon oxide such as SOG (Spin On Glass) or nano-clustering silica (NCS), a silica-based Low-k insulation film formed by introducing pores to a member similar to the above members (a porous type insulation film), or another silicon-based insulation film containing an above member as a main constituent component.

Further, as a silicon-based insulation film generally used in the semiconductor field along with a silicon-oxide-based insulation film, a silicon-nitride-based insulation film is used. As materials belonging to the type, there are SiN, SiCN, SiNH, SiCNH, and others. Here, when the term "silicon nitride" is cited, the term includes both SiN and SiNH unless otherwise particularly specified. Likewise, when the term "SiCN" is cited, the term includes both SiCN and SiCNH unless otherwise particularly specified.

Here, SiC has a nature similar to SiN but SiON should be classified rather as a silicon-oxide-based insulation film in many cases.

A silicon nitride film is not only used, frequently as an etching stop film in an SAC (Self-Aligned Contact) technology but also used as a stress imposing film in an SMT (Stress Memorization Technique).

Likewise, when the term "nickel silicide" is cited, the term generally means nickel monosilicide but includes not only comparatively pure nickel silicide but also an alloy, a mixed crystal, and others containing nickel monosilicide as the main constituent component. Further, silicide is not limited to nickel silicide but may be cobalt silicide, titanium silicide, tungsten silicide, and others, those being already proven. Furthermore, as a metal film for forming silicide, besides an Ni (nickel) film, a nickel alloy film such as an Ni—Pt alloy film (an alloy film of Ni and Pt), an Ni-V alloy film (an alloy film of Ni and V), an Ni—Pd alloy film (an alloy film of Ni and Pd), an Ni—Yb alloy film (an alloy film of Ni and Yb), or an Ni—Er alloy film (an alloy film of Ni and Er) can be used. Here, such silicide as containing nickel as the main metal element is collectively called "nickel based silicide".

3. Likewise, appropriate examples are shown with regard to drawings, positions, attributes, and the like but it goes without saying that they are not strictly limited to the examples except when it is particularly specified otherwise or when it is obviously otherwise from context.

4. Further, when a specific numerical value or quantity is cited, it may be a numerical value exceeding the specific value or may be a numerical value lower than the specific value except when it is particularly specified otherwise, when the number is limited theoretically, or when it is obviously otherwise from context.

5. When the term "a wafer" is cited, generally the term means a monocrystal silicon wafer over which a semiconductor integrated circuit device (a semiconductor device and an electronic device are included) is formed but it goes without saying that a composite wafer or the like including an insulation substrate such as an epitaxial wafer, an SOI substrate, or an LCD glass substrate and a semiconductor layer or the like is included.

Details of Embodiments

Embodiments are described further in detail. In the drawings, identical or similar parts are represented with identical or similar symbols or reference numerals and explanations are not repeated in principle.

Further, in attached drawings, hatching or the like for representing a cross section is sometimes omitted when it rather complicates the situation or when it can be obviously distinguished from a vacancy. In this regard, when it is obvious from explanations or the like, the profile line of the background may sometimes be omitted even in the case of a planarly closed hole. In contrast, even when a part is not a cross section, hatching may be applied sometimes in order to demonstrate that the part is not a vacancy.

1. Explanations of substantial processes, device structures, and the like in a manufacturing method (a double metal masking method) of a semiconductor integrated circuit device according to First Embodiment (basic example) of the present application (mainly FIGS. 1 to 18)

In the following explanations, embodiments are concretely explained by taking an SOC (System On Chip) product of a 28 nm technology node as an example but it goes without saying that the embodiments can be applied also to other products (a memory, a microcomputer, a signal processor, and others).

Figure 2:
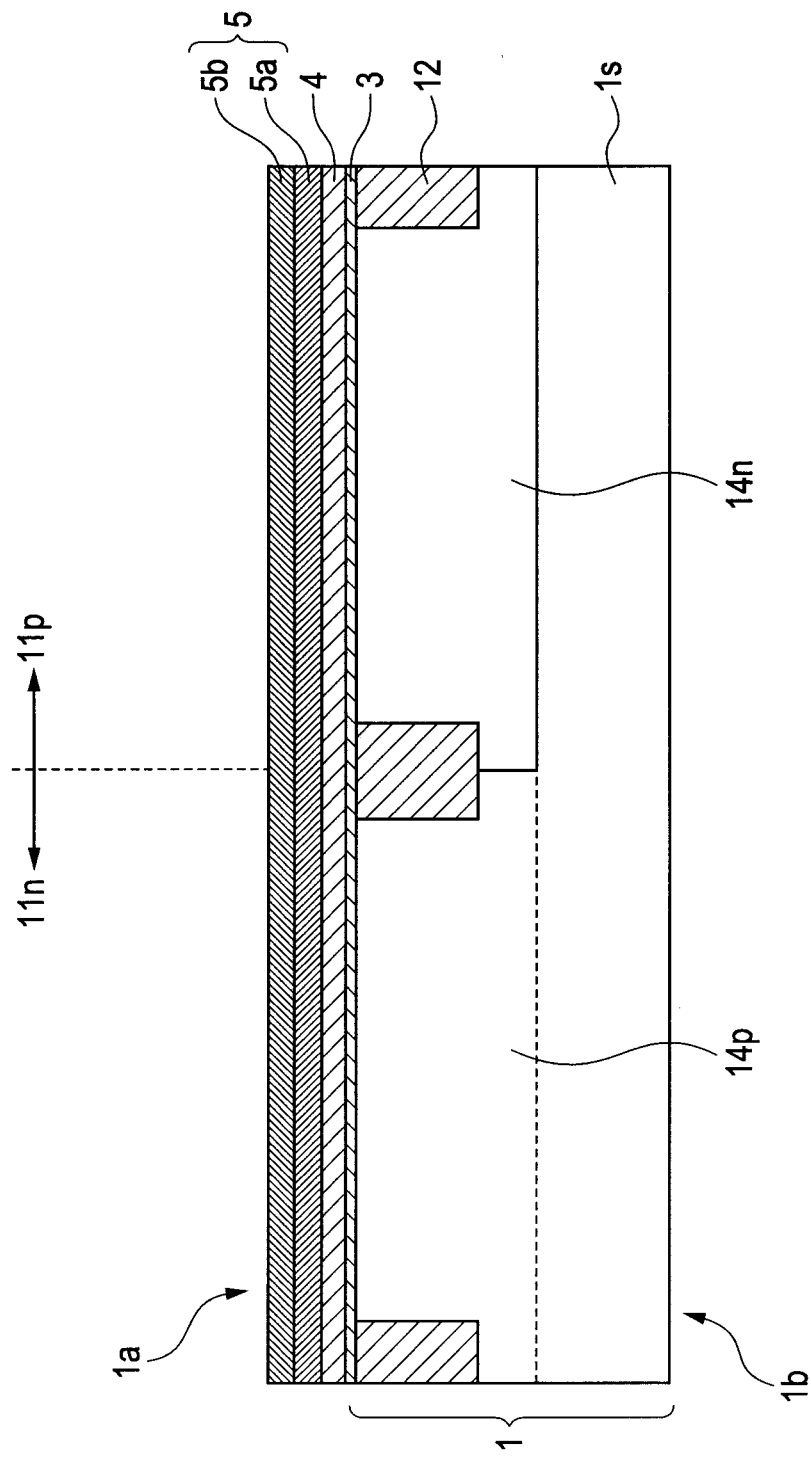
FIG. 2 is a sectional view of a device in a wafer process in a manufacturing method (a double metal masking method) of a semiconductor integrated circuit device according to First Embodiment (basic example) of the present application (a step of forming a P-channel side capping film and others).
Figure 3:
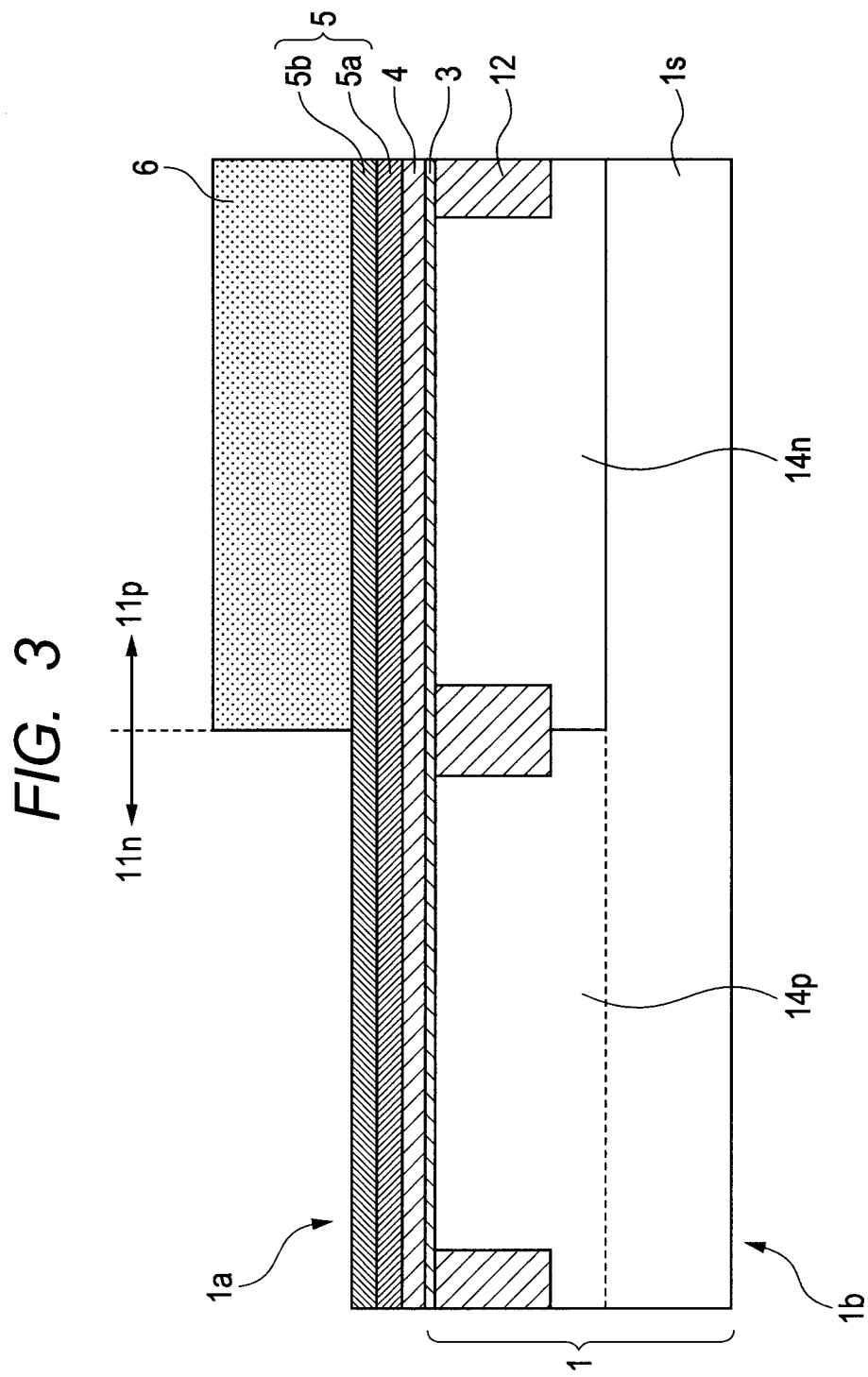
FIG. 3 is a sectional view of a device in a wafer process in a manufacturing method (a double metal masking method) of a semiconductor integrated circuit device according to First Embodiment (basic example) of the present application (a step of forming a resist pattern for patterning a P-channel side capping film and others).
Figure 4:
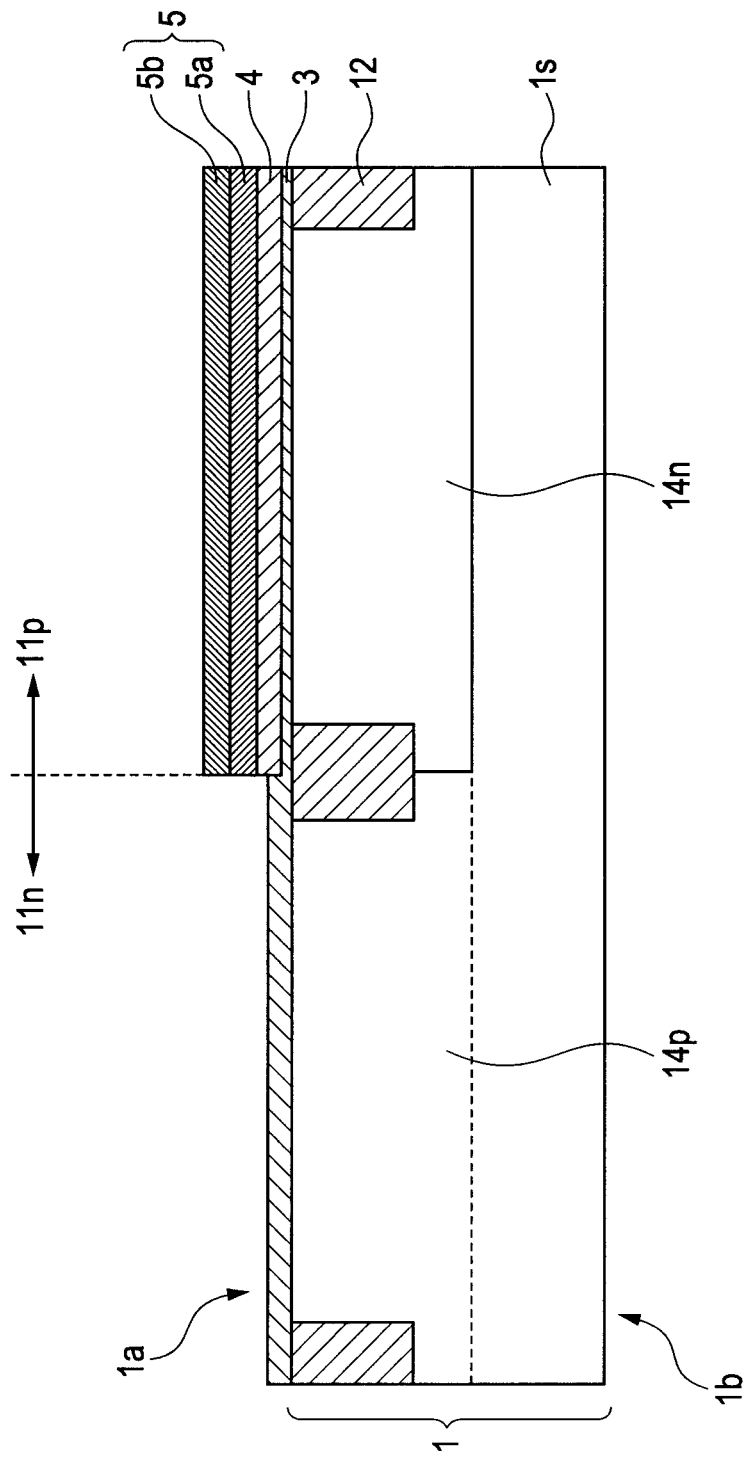
FIG. 4 is a sectional view of a device in a wafer process in a manufacturing method (a double metal masking method) of a semiconductor integrated circuit device according to. First Embodiment (basic example) of the present application (a step of patterning a P-channel side capping film and others).
Figure 5:
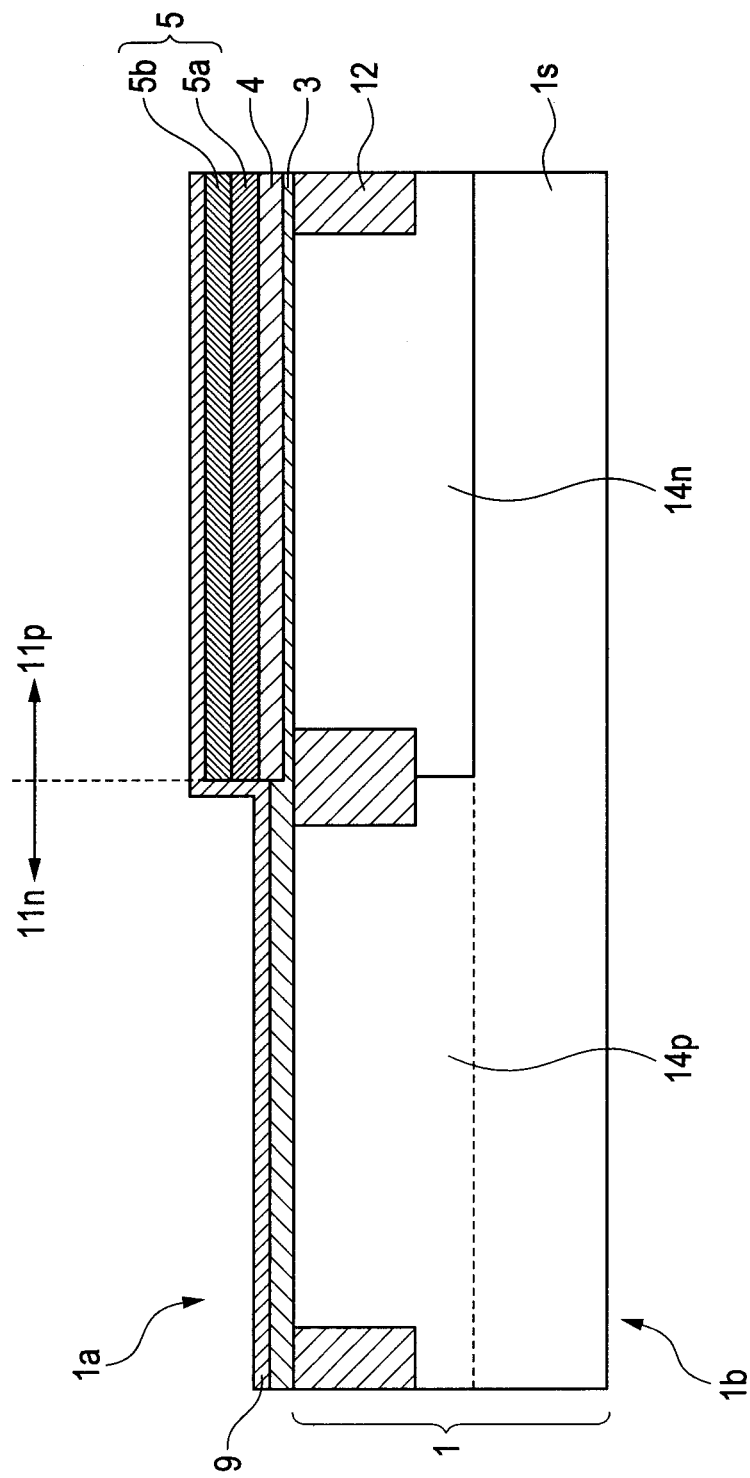
FIG. 5 is a sectional view of a device in a wafer process in a manufacturing method (a double metal masking method) of a semiconductor integrated circuit device according to First Embodiment (basic example) of the present application (a step of forming an N-channel side capping film and annealing).
Figure 6:
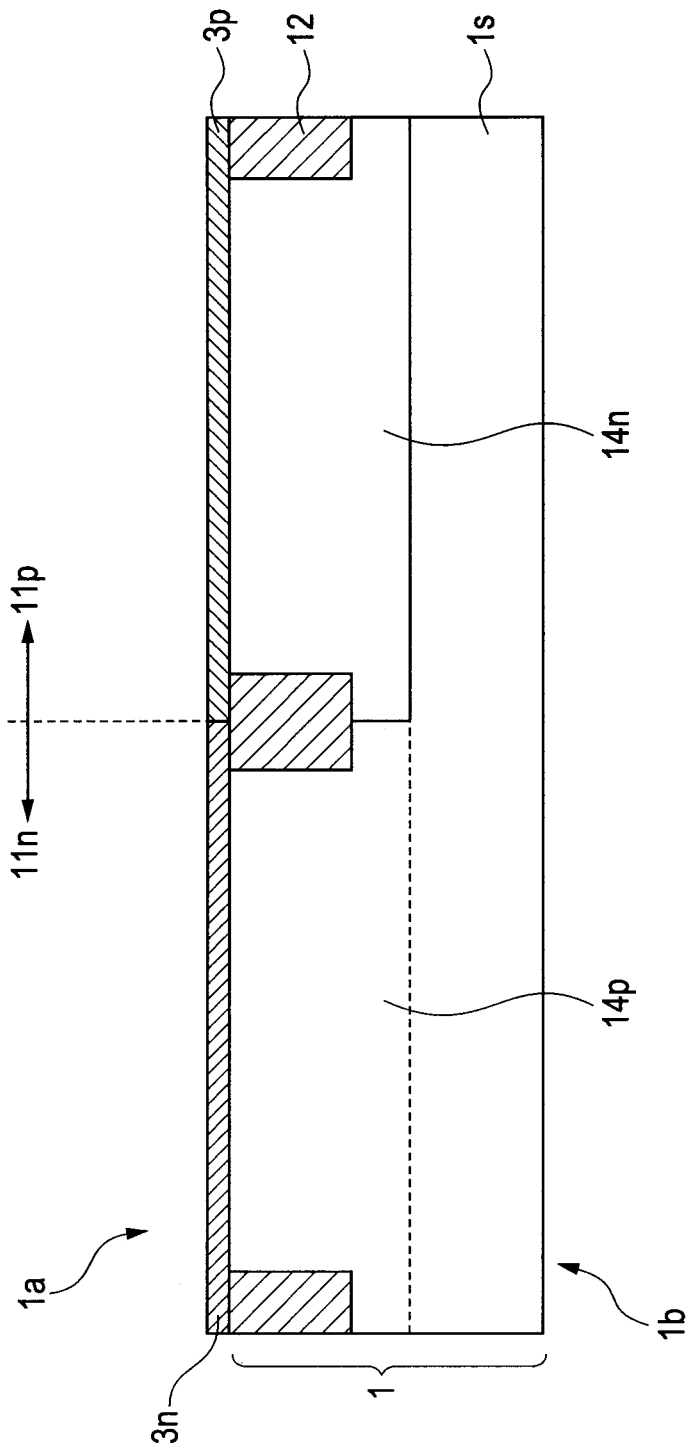
FIG. 6 is a sectional view of a device in a wafer process in a manufacturing method (a double metal masking method) of a semiconductor integrated circuit device according to First Embodiment (basic example) of the present application (a step of removing capping films and others after annealing).
Figure 7:
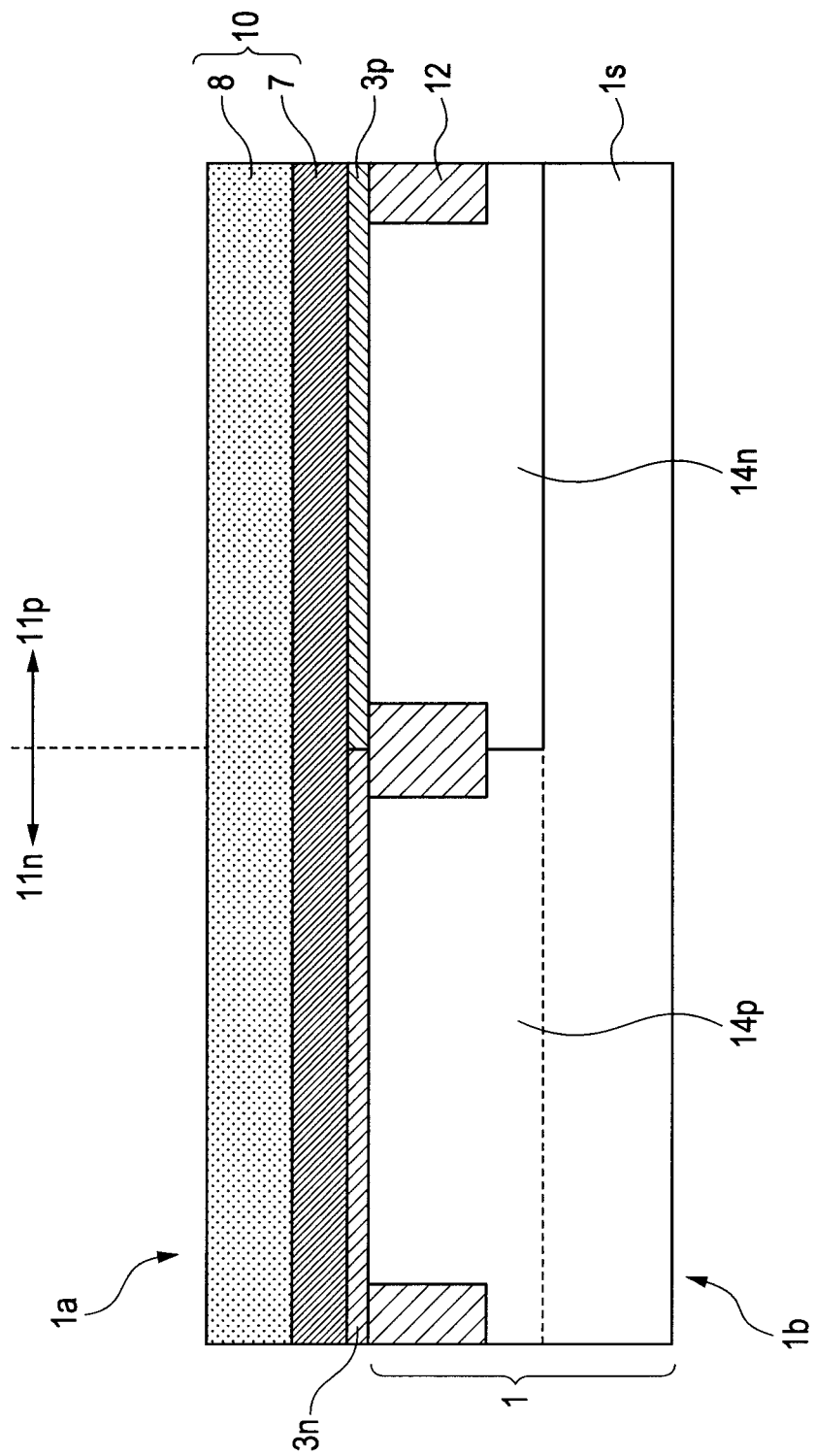
FIG. 7 is a sectional view of a device in a wafer process in a manufacturing method (a double metal masking method) of a semiconductor integrated circuit device according to First Embodiment (basic example) of the present application (a step of forming a gate electrode film).
Figure 8:
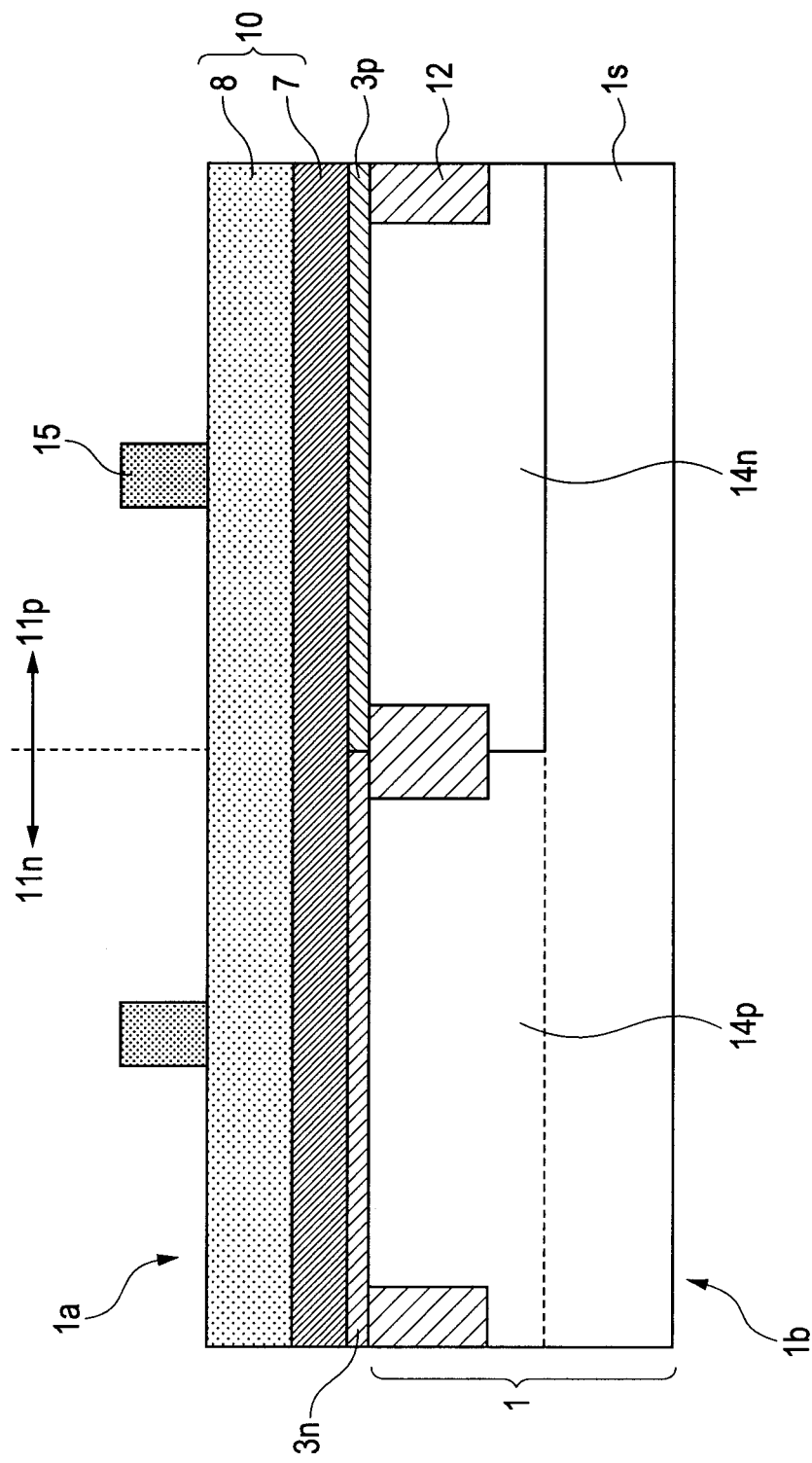
FIG. 8 is a sectional view of a device in a wafer process in a manufacturing method (a double metal masking method) of a semiconductor integrated circuit device according to First Embodiment (basic example) of the present application (a step of forming a resist film for processing a gate electrode film).
Figure 9:
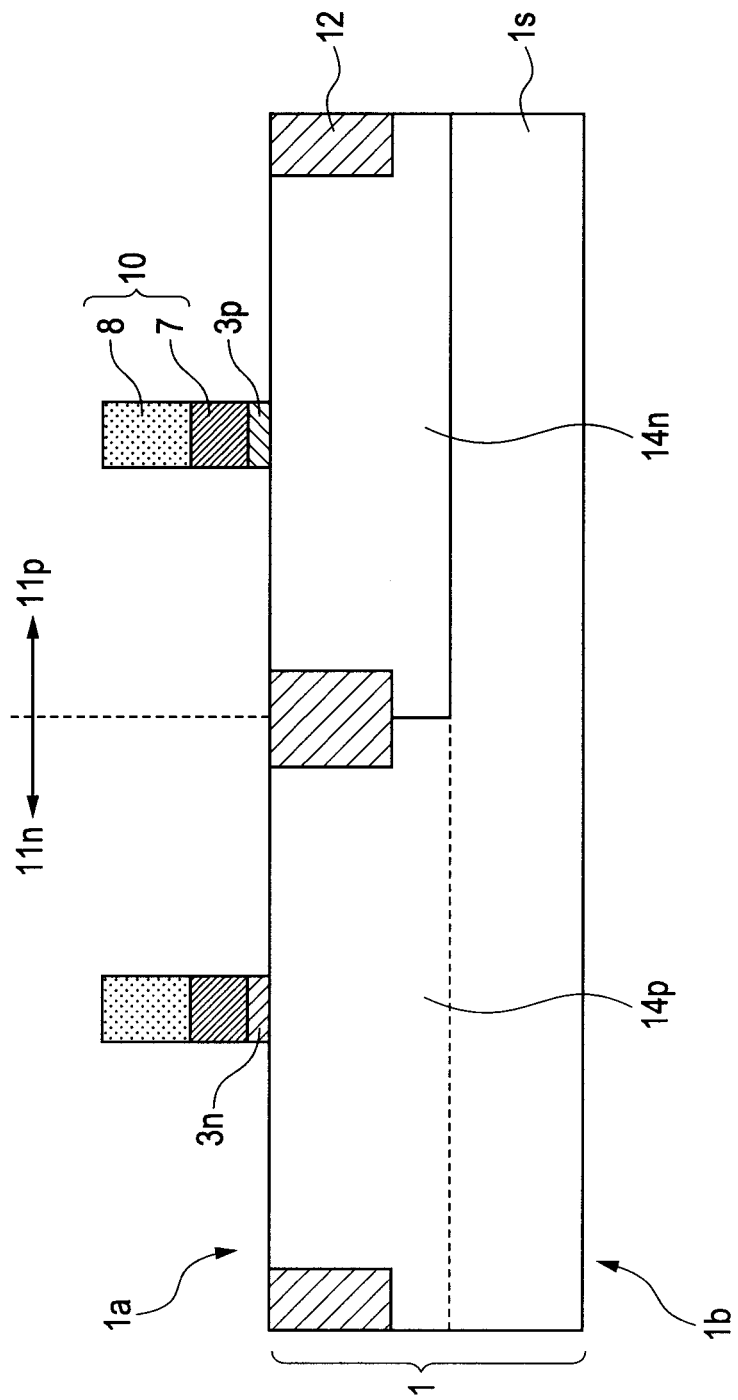
FIG. 9 is a sectional view of a device in a wafer process in a manufacturing method (a double metal masking method) of a semiconductor integrated circuit device according to First Embodiment (basic example) of the present application (a step of patterning a gate electrode film).
Figure 10:
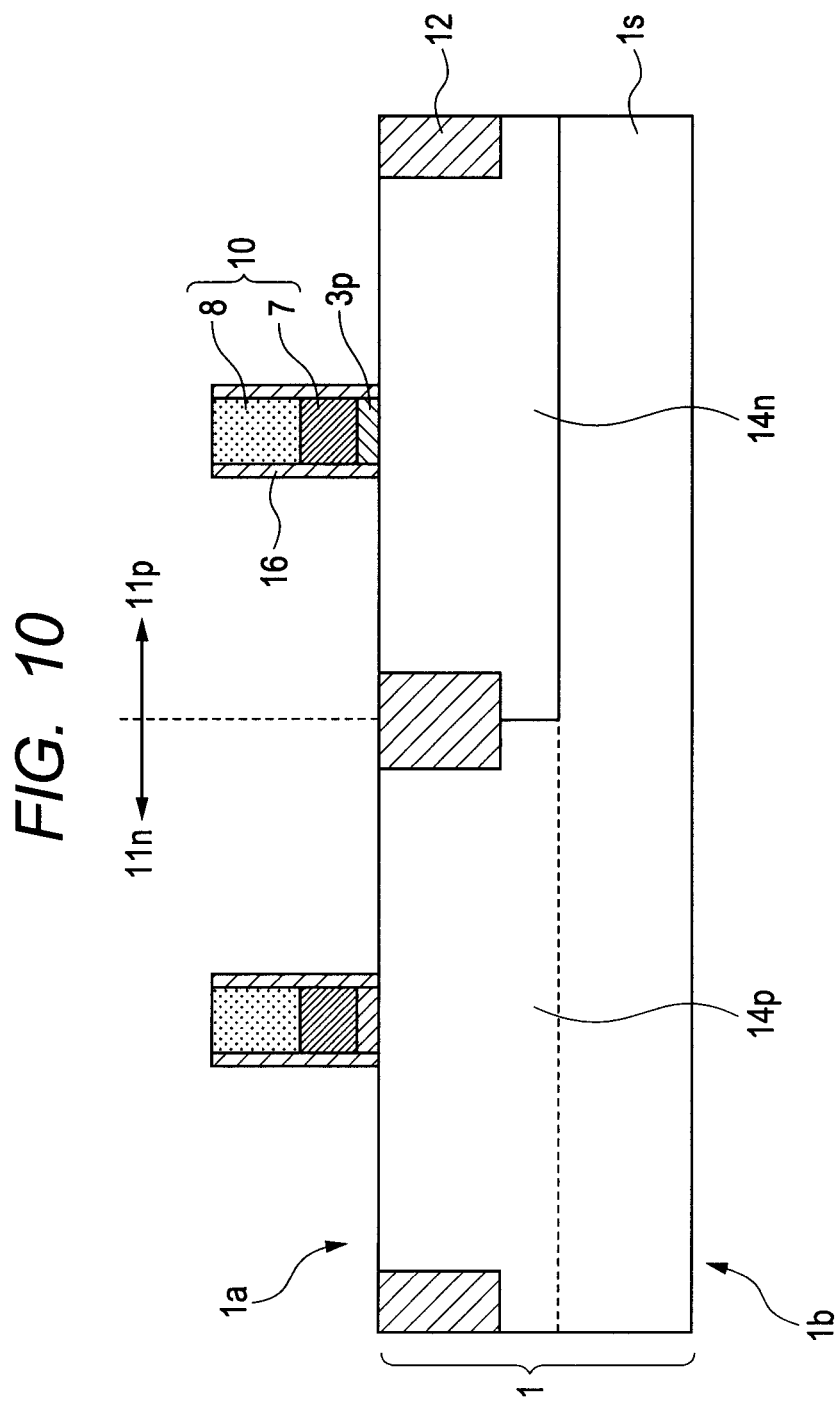
FIG. 10 is a sectional view of a device in a wafer process in a manufacturing method (a double metal masking method) of a semiconductor integrated circuit device according to First Embodiment (basic example) of the present application (a step of forming an offset spacer insulation film).
Figure 11:
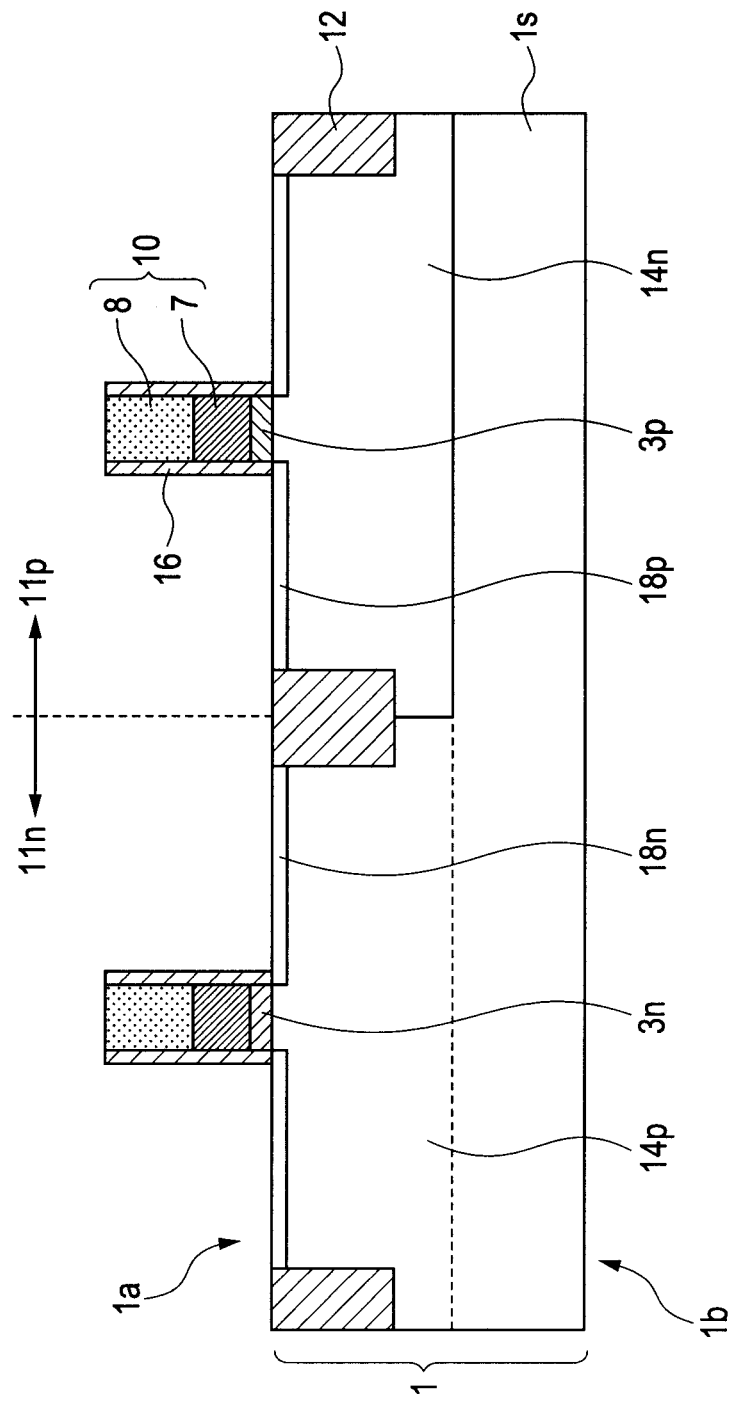
FIG. 11 is a sectional view of a device in a wafer process in a manufacturing method (a double metal masking method) of a semiconductor integrated circuit device according to First Embodiment (basic example) of the present application (a step of forming extension regions).
Figure 12:
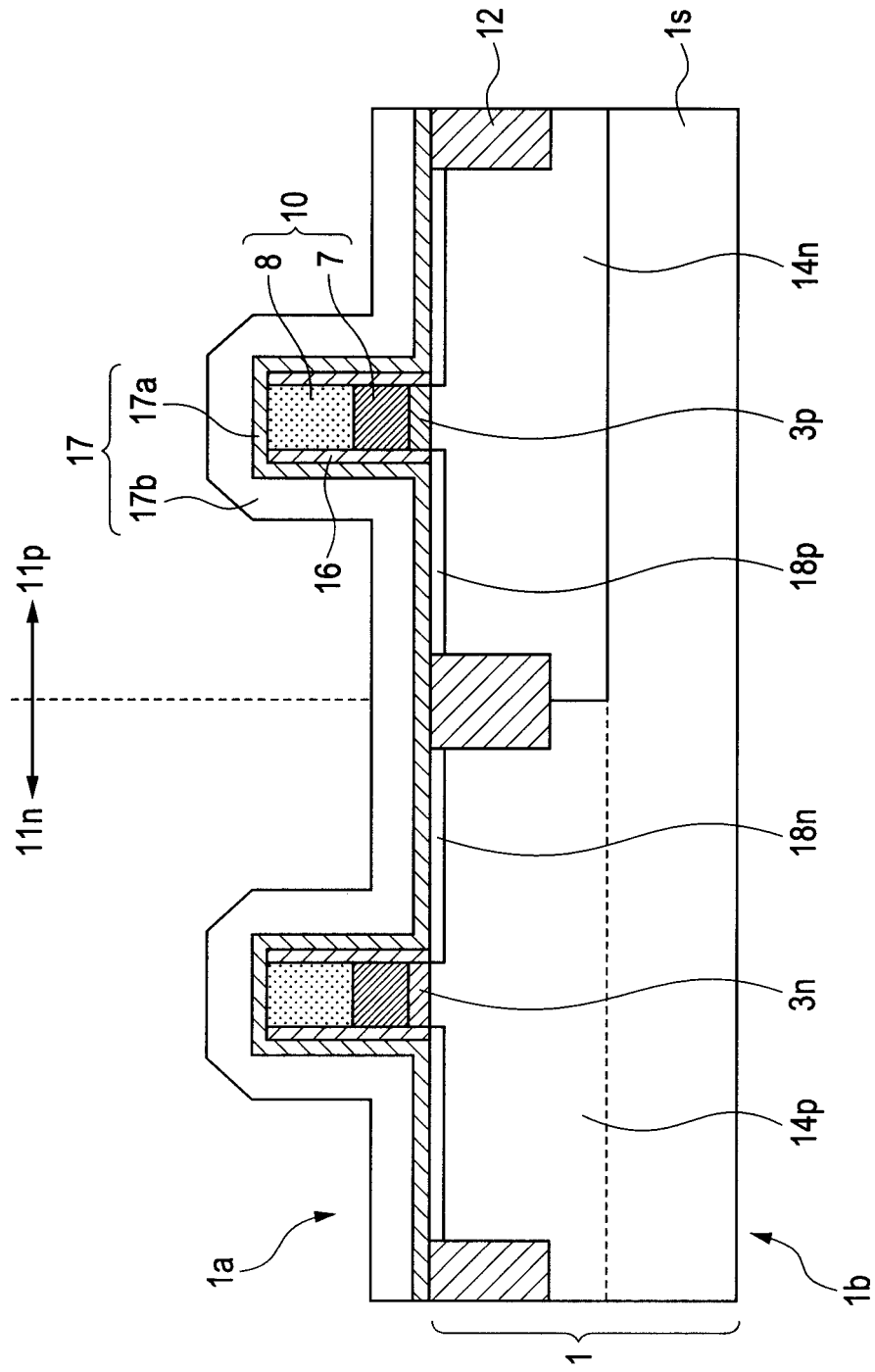
FIG. 12 is a sectional view of a device in a wafer process in a manufacturing method (a double metal masking method) of a semiconductor integrated circuit device according to First Embodiment (basic example) of the present application (a step of forming an oxide-film-based sidewall spacer insulation film).
Figure 13:
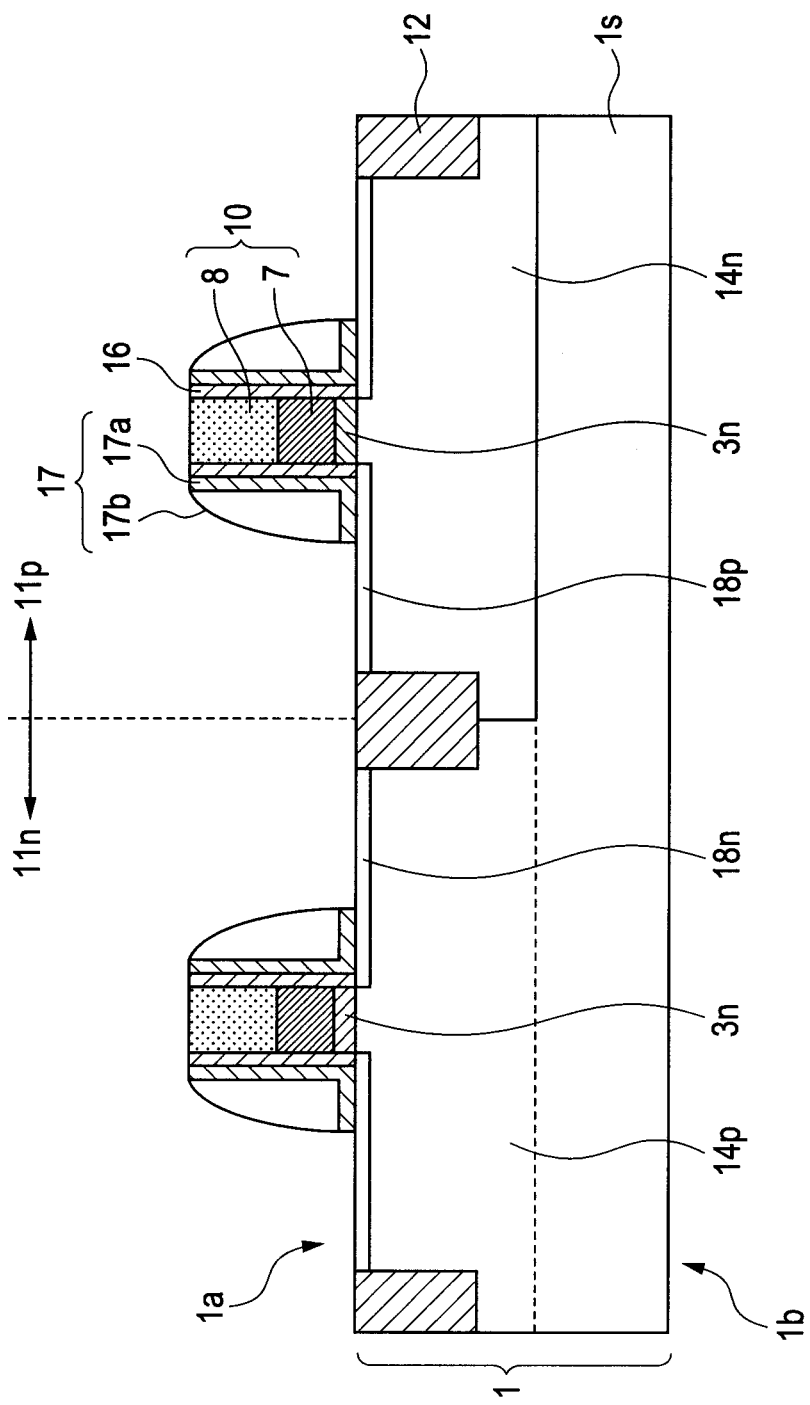
FIG. 13 is a sectional view of a device in a wafer process in a manufacturing method (a double metal masking method) of a semiconductor integrated circuit device according to First Embodiment (basic example) of the present application (a step of forming a nitride-film-based sidewall spacer insulation film).
Figure 14:
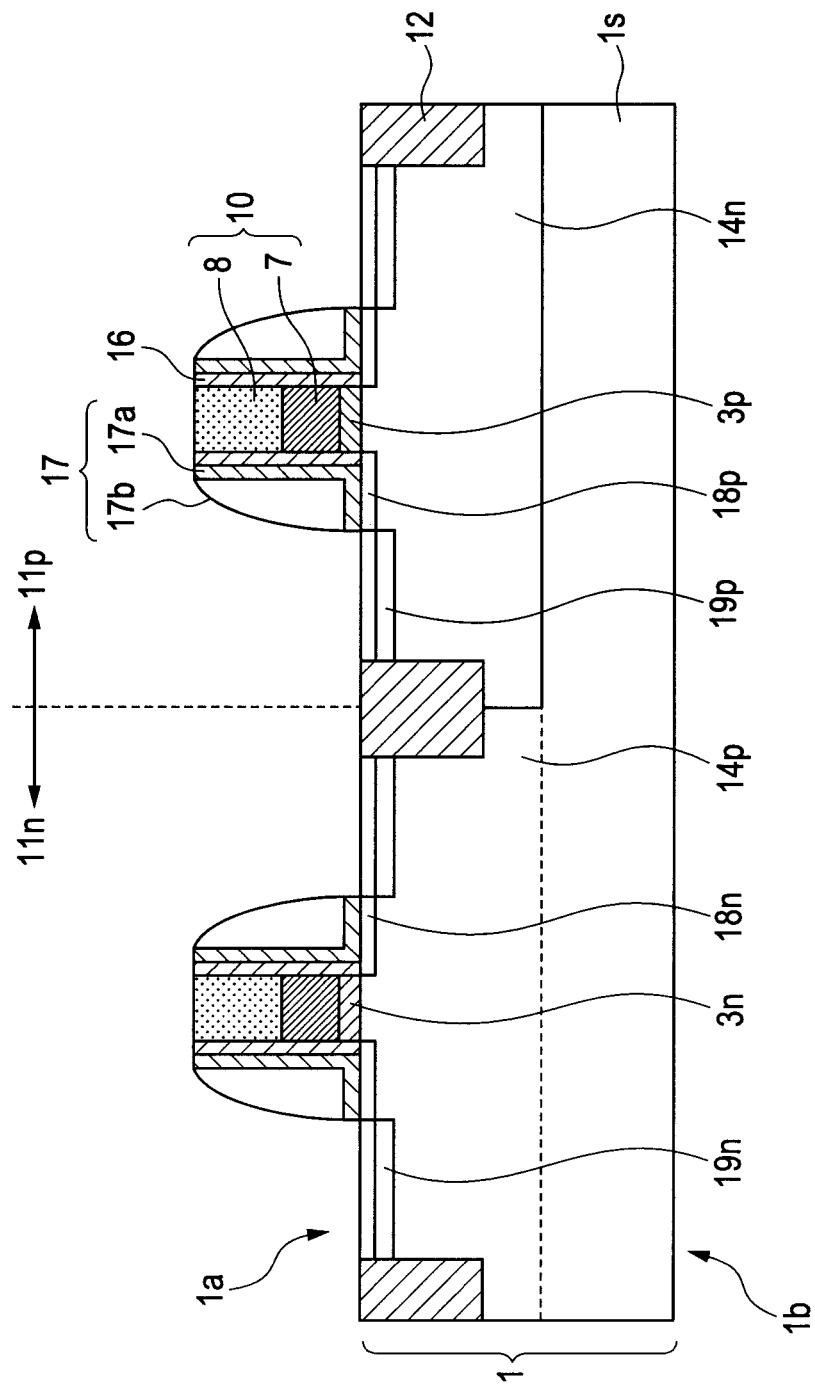
FIG. 14 is a sectional view of a device in a wafer process in a manufacturing method (a double metal masking method) of a semiconductor integrated circuit device according to First Embodiment (basic example) of the present application (a step of forming high-concentration source drain regions).
Figure 15:
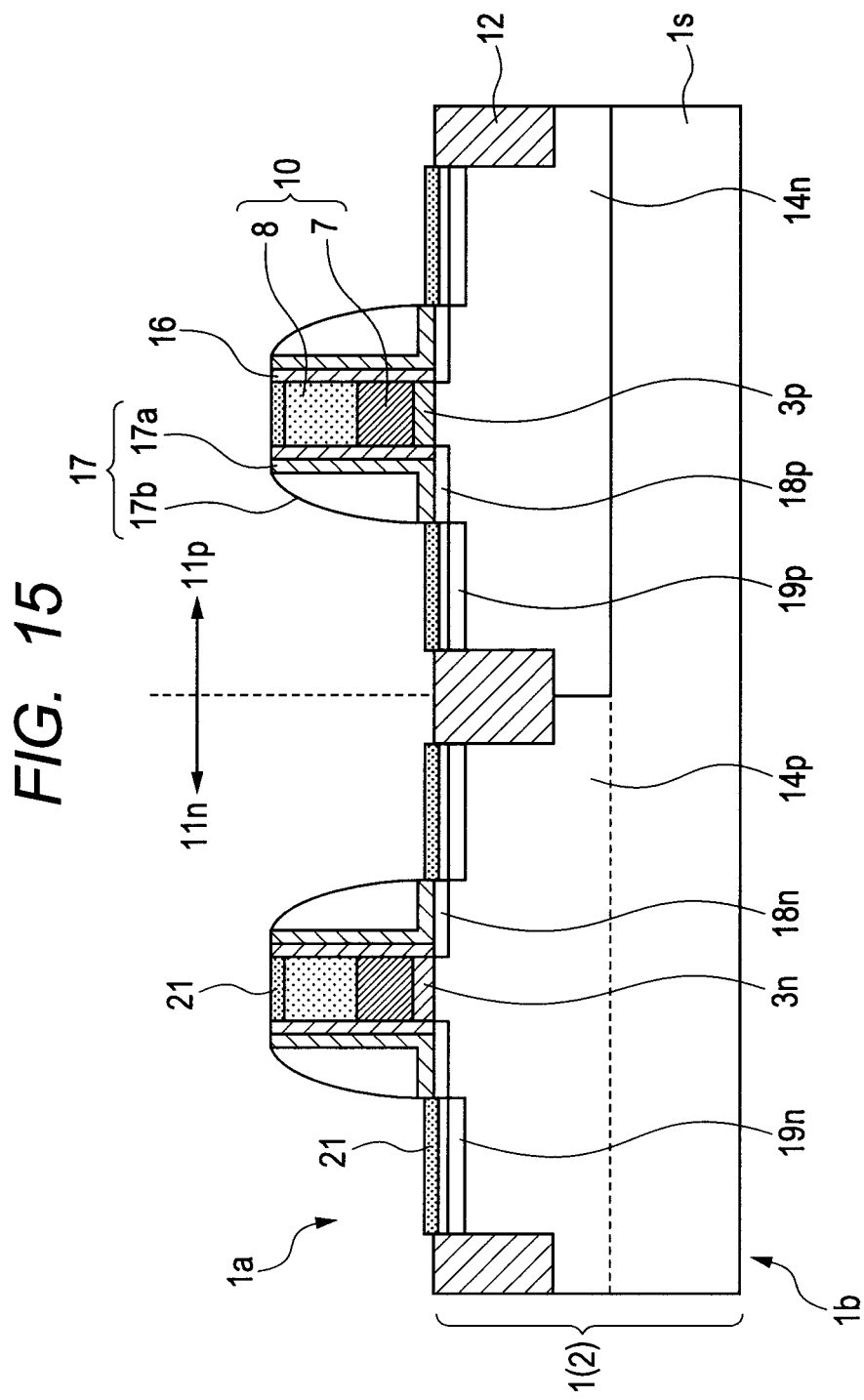
FIG. 15 is a sectional view of a device in a wafer process in a manufacturing method (a double metal masking method) of a semiconductor integrated circuit device according to First Embodiment (basic example) of the present application (a step of forming a silicide layer).
Figure 16:
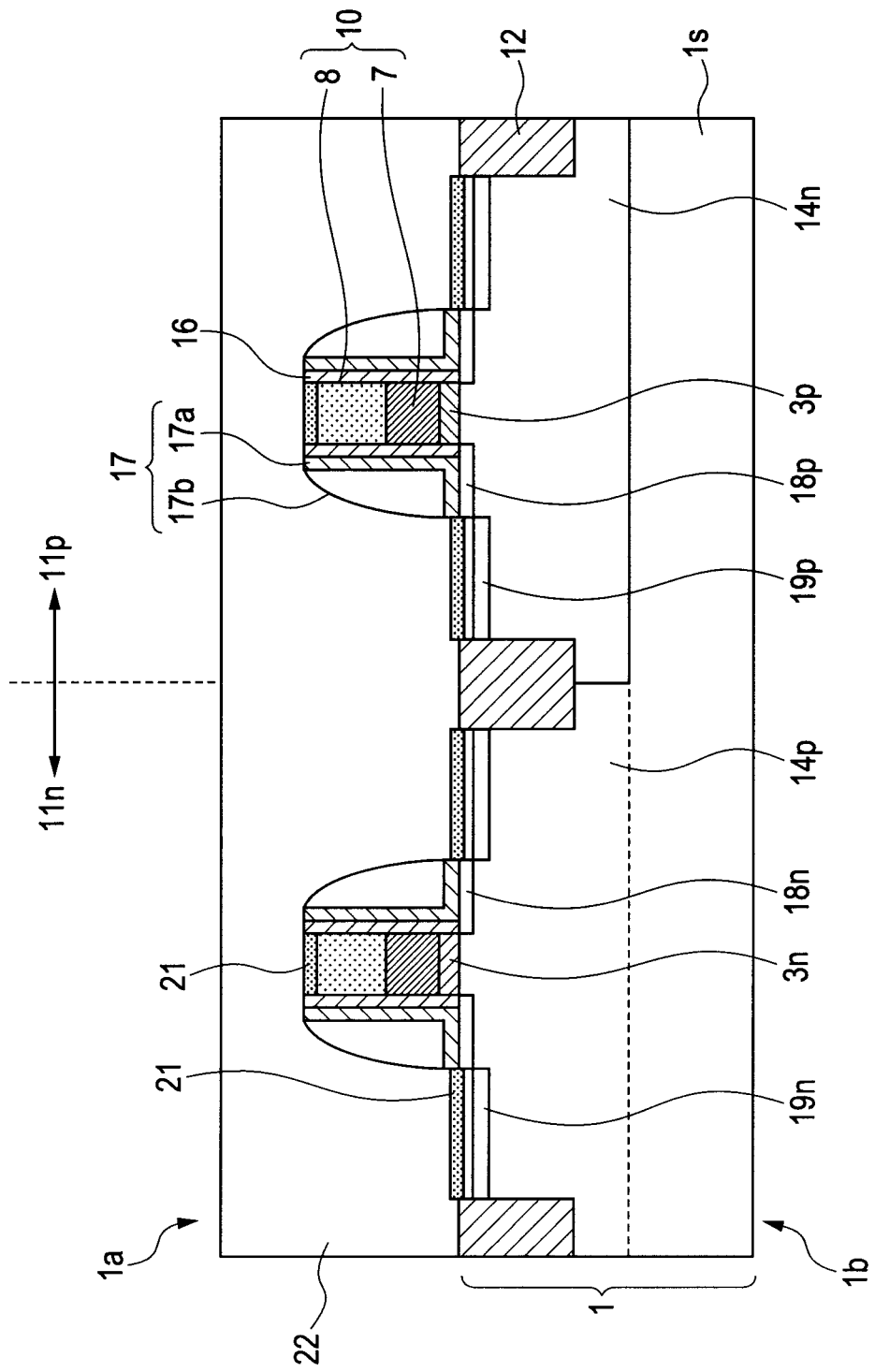
FIG. 16 is a sectional view of a device in a wafer process in a manufacturing method (a double metal masking method) of a semiconductor integrated circuit device according to First Embodiment (basic example) of the present application (a step of forming a pre-metal insulation film).
Figure 17:
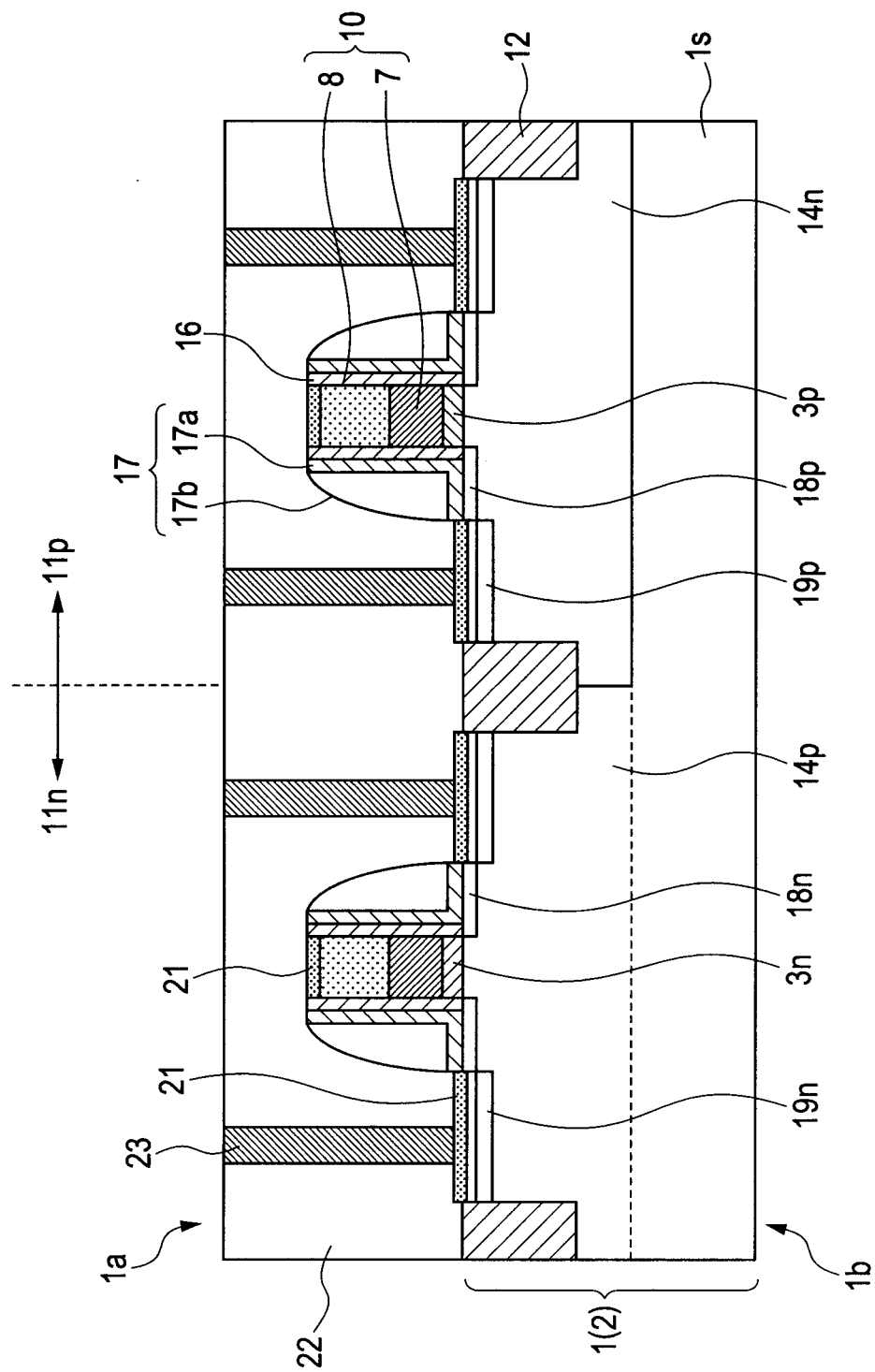
FIG. 17 is a sectional view of a device in a wafer process in a manufacturing method (a double metal masking method) of a semiconductor integrated circuit device according to First Embodiment (basic example) of the present application (a step of forming tungsten plugs).
Figure 18:
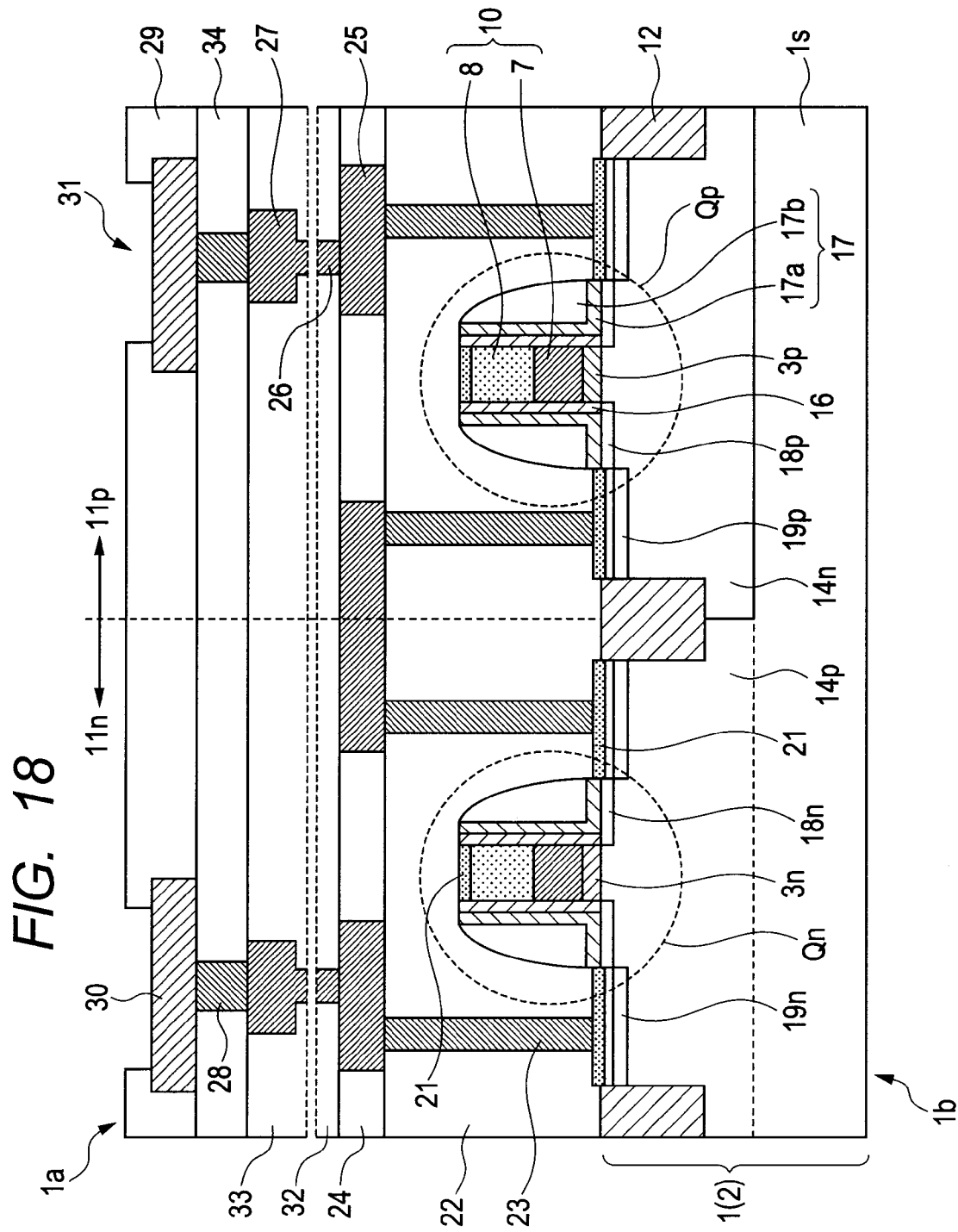
FIG. 18 is a sectional view of a device in a wafer process in a manufacturing method (a double metal masking method) of a semiconductor integrated circuit device according to First Embodiment (basic example) of the present application (a step of wiring).

FIG. 1 is a sectional view of a device in a wafer process in a manufacturing method (a double metal masking method) of a semiconductor integrated circuit device according to First Embodiment (basic example) of the present application (a step of introducing a well). FIG. 2 is a sectional view of a device in a wafer process in a manufacturing method (a double metal masking method) of a semiconductor integrated circuit device according to First Embodiment (basic example) of the present application (a step of forming a P-channel side capping film and others). FIG. 3 is a sectional view of a device in a wafer process in a manufacturing method (a double metal masking method) of a semiconductor integrated circuit device according to First Embodiment (basic example) of the present application (a step of forming a resist pattern for patterning a P-channel side capping film and others). FIG. 4 is a sectional view of a device in a wafer process in a manufacturing method (a double metal masking method) of a semiconductor integrated circuit device according to First Embodiment (basic example) of the present application (a step of patterning a P-channel side capping film and others). FIG. 5 is a sectional view of a device in a wafer process in a manufacturing method (a double metal masking method) of a semiconductor integrated circuit device according to First Embodiment (basic example) of the present application (a step of forming an N-channel side capping film and annealing). FIG. 6 is a sectional view of a device in a wafer process in a manufacturing method (a double metal masking method) of a semiconductor integrated circuit device according to First Embodiment (basic example) of the present application (a step of removing capping films and others after annealing). FIG. 7 is a sectional view of a device in a wafer process in a manufacturing method (a double metal masking method) of a semiconductor integrated circuit device according to First Embodiment (basic example) of the present application (a step of forming a gate electrode film). FIG. 8 is a sectional view of a device in a wafer process in a manufacturing method (a double metal masking method) of a semiconductor integrated circuit device according to First Embodiment (basic example) of the present application (a step of forming a resist film for processing a gate electrode film). FIG. 9 is a sectional view of a device in a wafer process in a manufacturing method (a double metal masking method) of a semiconductor integrated circuit device according to First Embodiment (basic example) of the present application (a step of patterning a gate electrode film). FIG. 10 is a sectional view of a device in a wafer process in a manufacturing method (a double metal masking method) of a semiconductor integrated circuit device according to First Embodiment (basic example) of the present application (a step of forming an offset spacer insulation film). FIG. 11 is a sectional view of a device in a wafer process in a manufacturing method (a double metal masking method) of a semiconductor integrated circuit device according to First Embodiment (basic example) of the present application (a step of forming extension regions). FIG. 12 is a sectional view of a device in a wafer process in a manufacturing method (a double metal masking method) of a semiconductor integrated circuit device according to First Embodiment (basic example) of the present application (a step of forming an oxide-film-based sidewall spacer insulation film). FIG. 13 is a sectional view of a device in a wafer process in a manufacturing method (a double metal masking method) of a semiconductor integrated circuit device according to First Embodiment (basic example) of the present application (a step of forming a nitride-film-based sidewall spacer insulation film). FIG. 14 is a sectional view of a device in a wafer process in a manufacturing method (a double metal masking method) of a semiconductor integrated circuit device according to First Embodiment (basic example) of the present application (a step of forming high-concentration source drain regions). FIG. 15 is a sectional view of a device in a wafer process in a manufacturing method (a double metal masking method) of a semiconductor integrated circuit device according to First Embodiment (basic example) of the present application (a step of forming a silicide layer). FIG. 16 is a sectional view of a device in a wafer process in a manufacturing method (a double metal masking method) of a semiconductor integrated circuit device according to First Embodiment (basic example) of the present application (a step of forming a pre-metal insulation film). FIG. 17 is a sectional view of a device in a wafer process in a manufacturing method (a double metal masking method) of a semiconductor integrated circuit device according to First Embodiment (basic example) of the present application (a step of forming tungsten plugs). FIG. 18 is a sectional view of a device in a wafer process in a manufacturing method (a double metal masking method) of a semiconductor integrated circuit device according to First Embodiment (basic example) of the present application (a step of wiring). On the basis of the figures, substantial processes, device structures, and others in a manufacturing method (a double metal masking method) of a semiconductor integrated circuit device according to First Embodiment (basic example) of the present application are explained.

Firstly, a P-type monocrystal silicon substrate 1 (here, a 300ϕ) wafer is used for example but a 450 ϕ or less than 300 ϕ wafer may also be used) having a resistivity of about 1 to 10 Ωcm for example is prepared. Here, an epitaxial wafer or an SOI (Silicon On Insulator) type wafer may be used instead of a simple monocrystal silicon substrate (including a silicon-based substrate). Otherwise, an N-type monocrystal silicon substrate or the like may be used if necessary.

Successively as shown in FIG. 1, in the manner of partitioning an N-channel MISFET region 11$n$ and a P-channel MISFET region 11$p$, an STI (Shallow Trench Isolation) insulation film 12 is formed at the boundary of those regions and other parts. Subsequently, by implanting impurity ions from a top surface 1$a$ (the surface on the other side of a bottom surface 1$b$) of the semiconductor wafer 1 (the substrate part 1$s$), a P well region 14$p$ and an N well region 14$n$ are formed in the N-channel MISFET region 11$n$ and the P-channel MISFET region 11$p$ respectively in the vicinity of the top surface 1$a$ of the semiconductor wafer 1.

Successively as shown in FIG. 2, over the nearly whole area of the top surface 1$a$ of the semiconductor wafer 1, a high-k gate insulation film 3 (a high-permittivity insulation film), a P-channel side capping insulation film 4, and a metal masking film 5 including a lower layer metal masking film 5$a$ and an upper layer metal masking film 5$b$ for example are formed in sequence.

Here, a preferred example of the high-permittivity insulation film 3 is a hafnium-oxide-based insulation film (that is, a film having a hafnium-oxide-based insulation film as a main constituent component) such as a hafnium oxide film (a hafnia film, namely HfO$_2$) or the like. A preferred example of conditions for forming the hafnium oxide film 3 is film thickness: about 1 nm for example, film forming method: ALD (Atomic Layer Deposition) for example, and gas type: HfCl$_4$, H$_2$O, or the like for example. Other examples of the high-permittivity insulation film 3 are: a zirconium-oxide-based insulation film; HfSiON; and oxide, oxynitride, and oxynitride silicide of Hf, La, Al, or the like.

A preferred example of the P-channel side capping insulation film 4 is an aluminum-oxide-based insulation film (that is, a film having an aluminum-based film or an aluminum-oxide-based film as a main constituent component) such as an aluminum oxide film. (an alumina film). A preferred example of conditions for forming the aluminum oxide film 4 is film thickness: about 1 nm for example (as a range, 0.1 nm or more and 2 nm or less for example), film forming method: sputtering film forming for example, and gas type (gas atmosphere): argon or the like for example. Another example of the P-channel side capping insulation film 4 is: an aluminum, Pt, Ir, Ni, or Ru film; or a film containing oxide, nitride, carbide, silicide, nitride silicide, carbonitride, or the like of each of those elements.

A preferred example of the metal masking film 5 is a titanium-based nitride film (that is, a film having a titanium-based nitride film as a main constituent component) such as a titanium nitride film. A preferred example of conditions for forming the lower layer metal masking film 5a is film thickness: about 5 nm for example, film forming method: reactive sputtering film forming for example (CVD or the like may also be used), gas type (gas atmosphere): nitrogen for example (gas flow rate: about 3 sccm for example) or the like, treatment pressure: about 10 millipascal for example, treatment temperature: room temperature for example, and element composition ratio (Ti/N), namely the first element composition ratio: about 0.88 for example (as a preferred range, 0.87 or more and 0.9 or less for example). A preferred example of conditions for forming the upper layer metal masking film 5b is film thickness: about 5 nm for example, film forming method: reactive sputtering film forming for example (CVD or the like may also be used), gas type (gas atmosphere): nitrogen for example (gas flow rate: about 12 sccm for example) or the like, treatment pressure: about 10 millipascal for example, treatment temperature: room temperature for example, and element composition ratio (Ti/N), namely the second element composition ratio: about 0.81 for example (as a preferred range, 0.77 or more and 0.84 or less for example). Another example of the metal masking film 5 is a high-melting point metal nitride film such as TiAlN, TaN, TaNC, or the like.

Successively as shown in FIG. 3, a resist film 6 (an ultraviolet resist film, an X-ray resist film, an electron beam resist film, or the like) for removing the capping film and others is: applied for example over the nearly whole area of the top surface 1a of the semiconductor wafer 1; and patterned for example by ordinary lithography (ultraviolet lithography, X-ray lithography, electron beam lithography, or the like).

Successively as shown in FIG. 4, wet etching treatment is applied to the side of the top surface 1a of the semiconductor wafer 1 using the patterned resist film 6 for removing the capping film and others as a mask and thereby the P-channel side capping insulation film 4 and the metal masking film 5 in the N-channel MISFET region 11n are removed. After that, the no-longer-necessary resist film 6 for removing the capping film and others is removed.

Here, a preferred example of a chemical liquid used for the wet etching treatment is SPM (Sulfuric Acid Hydrogen Peroxide Mixture). Then another example of the chemical liquid is HPM (Hydrochloric Acid Hydrogen Peroxide Mixture) or the like.

Successively as shown in FIG. 5, an N-channel side capping insulation film 9 is formed over the nearly whole area of the top surface 1a of the semiconductor wafer 1. Subsequently, by applying annealing treatment (for example, RTA treatment at about 850° C.) to the top surface 1a of the semiconductor wafer 1, interdiffusion and the like of elements and the like between the capping films 4 and 9 and the like (including the metal masking film 5) and the high-permittivity insulation film 3 are advanced. By so doing, the high-permittivity insulation film 3 is modified: into an N-channel side gate insulation film 3n after the capping film is removed in the N-channel MISFET region 11n; and into a P-channel side gate insulation film 3p after the capping film is removed in the P-channel MISFET region 11p.

Here, a preferred example of the N-channel side capping insulation film 9 is a lanthanum-oxide-film-based insulation film (that is, a film having a lanthanum-oxide-based insulation film as a main constituent component). A preferred example of conditions for forming the lanthanum oxide film 9 is film thickness: about 1 nm for example (as a range, 0.5 nm or more and 2 nm or less for example), film forming method: sputtering film forming for example, and gas type (atmospheric gas): argon gas or the like for example. Another example of the N-channel side capping insulation film 9 is: an La, Hf, Ta, Mg, Yb, or In film; or a film containing oxide, nitride, carbide, silicide, nitride silicide, carbonitride, or the like of each of those elements.

Successively as shown in FIG. 6, by applying wet etching treatment to the side of the top surface 1a of the semiconductor wafer 1, the remaining capping insulation films 4 and 9 and metal masking film 5 are removed. By so doing, the high-permittivity insulation film 3 changes: to the N-channel side gate insulation film 3n after the capping film is removed in the N-channel MISFET region 11n; and to the P-channel side gate insulation film 3p after the capping film is removed in the P-channel MISFET region 11p. Those films are collectively called a high-permittivity gate insulation film.

Here, a preferred example of a chemical liquid used for the wet etching treatment is SPM (Sulfuric Acid Hydrogen Peroxide Mixture), namely an SPM-based etching liquid. Then another example of the chemical liquid is HPM (Hydrochloric Acid Hydrogen Peroxide Mixture), namely an HPM-based etching liquid, or the like.

Successively as shown in FIG. 7, over the high-permittivity gate insulation film (the N-channel side gate insulation film 3n and the P-channel side gate insulation film 3p), a composite gate electrode film 10 including a metal gate electrode film 7, a polysilicon gate electrode film 8 (including amorphous silicon), and the like in sequence is formed.

Here, a preferred example of the metal gate electrode film 7 is a titanium-based nitride film such as a titanium nitride film. A preferred example of conditions for forming the titanium nitride film 7 is film thickness: about 10 nm for example (as a range, 2 nm or more and 30 nm or less for example), film forming method: reactive sputtering film forming for example (CVD or the like may also be used), gas type (gas atmosphere): nitrogen for example (gas flow rate: about 10 sccm for example) or the like, treatment pressure: about 10 millipascal for example, treatment temperature: room temperature for example, and element composition ratio (Ti/N): about 0.85 for example (a preferred example of the range is from less than 0.87 to more than 0.77 and a yet preferred example of the range is from less than 0.87 to more than 0.84). Any of those element composition ratios is smaller than the first element composition ratio. Here, the latter element composition ratio is smaller than the first element composition ratio and larger than the second element composition ratio. Another example of the metal gate electrode film 7 is a high-melting point metal nitride film or the like such as TiAlN, TaN, or TaNC.

A preferred example of conditions for forming the polysilicon gate electrode film 8 is film thickness: about 50 nm for example (as a range, 30 nm or more and 120 nm or less for example), and film forming method: LP-CVD (Low Pressure-CVD) for example.

Successively as shown in FIG. 8, the nearly whole area of the polysilicon gate electrode film 8 (the composite gate electrode film 10) over the nearly whole area of the top surface 1a of the semiconductor wafer 1 is coated with a resist film 15 for processing a gate electrode for example. Subsequently, the resist film 15 for processing a gate electrode is patterned for example by ordinary lithography (ultraviolet lithography, X-ray lithography, electron beam lithography, or the like).

Successively as shown in FIG. 9, the high-permittivity gate insulation film (the N-channel side gate insulation film 3n and the P-channel side gate insulation film 3p) and the composite gate electrode film 10 are patterned using the patterned resist film 15 for processing a gate electrode as a mask by anisotropic dry etching. After that, the no-longer-necessary resist film 15 for processing a gate electrode is removed.

Successively as shown in FIG. 10, an offset spacer insulation film 16 (a silicon oxide or silicon nitride film about 3 to 6 nm in thickness for example) is formed over the nearly whole area on the side of the top surface 1a of the semiconductor wafer 1. Subsequently, etch back is applied by anisotropic dry etching and thereby the offset spacer insulation film 16 is formed over the sidewall of the gate electrode and others.

Successively as shown in FIG. 11, an N-type extension region 18n and a P-type extension region 18p are formed in sequence by ion implantation.

Successively as shown in FIG. 12, an oxide-film-based sidewall spacer insulation film 17a (a silicon oxide film about 5 to 10 nm in thickness for example) and a nitride-film-based sidewall spacer insulation film 17b (a silicon oxide or silicon nitride film about 10 to 30 nm in thickness for example) are formed in sequence over the nearly whole area on the side of the top surface 1a of the semiconductor wafer 1. Here, the oxide-film-based sidewall spacer insulation film 17a and the nitride-film-based sidewall spacer insulation film 17b configure a sidewall spacer insulation film 17.

Successively as shown in FIG. 13, by etching back the sidewall spacer insulation film 17 by anisotropic dry etching (as the etching gas, a fluorocarbon-based gas is used for example), the sidewall spacer insulation film 17 is formed over and around the sidewall of the gate electrode and others.

Successively as shown in FIG. 14, an N-type high-concentration source drain region 19n (the ion species is arsenic for example) and a P-type high concentration source drain region 19p (the ion species is boron for example) are formed in sequence by ion implantation. Simultaneously on this occasion, impurities are introduced into the polysilicon layer.

Successively as shown in FIG. 15, by a salicide process, a silicide film 21 (a nickel-based silicide film for example) is formed in the silicon-based surface region over the surface of the source drain regions 19n and 19p and the top surface region of the polysilicon gate electrode film 8.

Successively as shown in FIG. 16, a pre-metal insulation film 22 is formed over the nearly whole area on the side of the top surface 1a of the semiconductor wafer 1. Here if necessary, the surface is smoothened by CMP (Chemical Mechanical Polishing) or the like. The pre-metal insulation film 22 may include, for example: a silicon nitride film as the lower layer; and a relatively thick silicon-oxide-based film (HDP-CVD, plasma TEOS-SiO$_2$, SOG, or the like for example) as the upper layer.

Successively as shown in FIG. 17, contact holes are formed in the pre-metal insulation film 22 by anisotropic dry etching and tungsten plugs 23 (usually accompanying a barrier metal layer of TiN/Ti or the like) are embedded into the contact holes.

Successively as shown in FIG. 18, a first layer interlayer insulation film 24 (mainly including a silicon-oxide-based insulation film such as an SiOC film for example and accompanying a copper-diffused barrier insulation film such as SiCN at boundaries for example, the same is applied to interlayer insulation films to be described below) is formed over the pre-metal insulation film 22 and a first layer embedded wiring 25 (a copper-based wiring by a single damascene method for example) is formed there. Subsequently, a second layer interlayer insulation film 32 is formed over the first layer interlayer insulation film 24 and a second layer embedded wiring 26 (a copper-based wiring by a dual damascene method for example) is formed there. By repeating the processes in sequence, an N-th layer embedded wiring 27 is formed in an N-th layer interlayer insulation film 33. Subsequently, an under-pad interlayer insulation film 34 (a silicon-oxide-based insulation film for example) is formed over the N-th layer interlayer insulation film 33 and under-pad tungsten plugs 28 are embedded therein. Subsequently, aluminum-based bonding pads 30 are formed over the under-pad interlayer insulation film 34. Subsequently, a final passivation film 29 (including a silicon-oxide-based insulation film, a silicon-nitride-based insulation film, or the like and sometimes accompanying an organic insulation film such as a polyimide film in the upper layer for example) is formed in the manner of covering the under-pad interlayer insulation film 34 and the aluminum-based bonding pads 30. Subsequently, pad openings 31 are formed in the final passivation film 29. Thereafter, the wafer 1 is divided into individual semiconductor chips 2 by dicing (a blade dicing method, a laser dicing method, or a pelletizing method combining both the methods) or the like.

Through the above processes, an integrated circuit device incorporating an N-channel MISFET (Qn) and a P-channel MISFET (Qp) is almost completed.

2. Explanations of the device structures (double metal gate electrode type MISFET) of a semiconductor integrated circuit device according to Second Embodiment (basic example) of the present application and the substantial processes thereof (mainly FIGS. 19 to 25)

This embodiment is the case where the metal masking film 5 (having a double structure, in particular) is applied to the metal gate electrode film 7 in the section 1, thus the process flow itself is nearly identical, and hence only different points are explained hereunder in principle.

Figure 19:
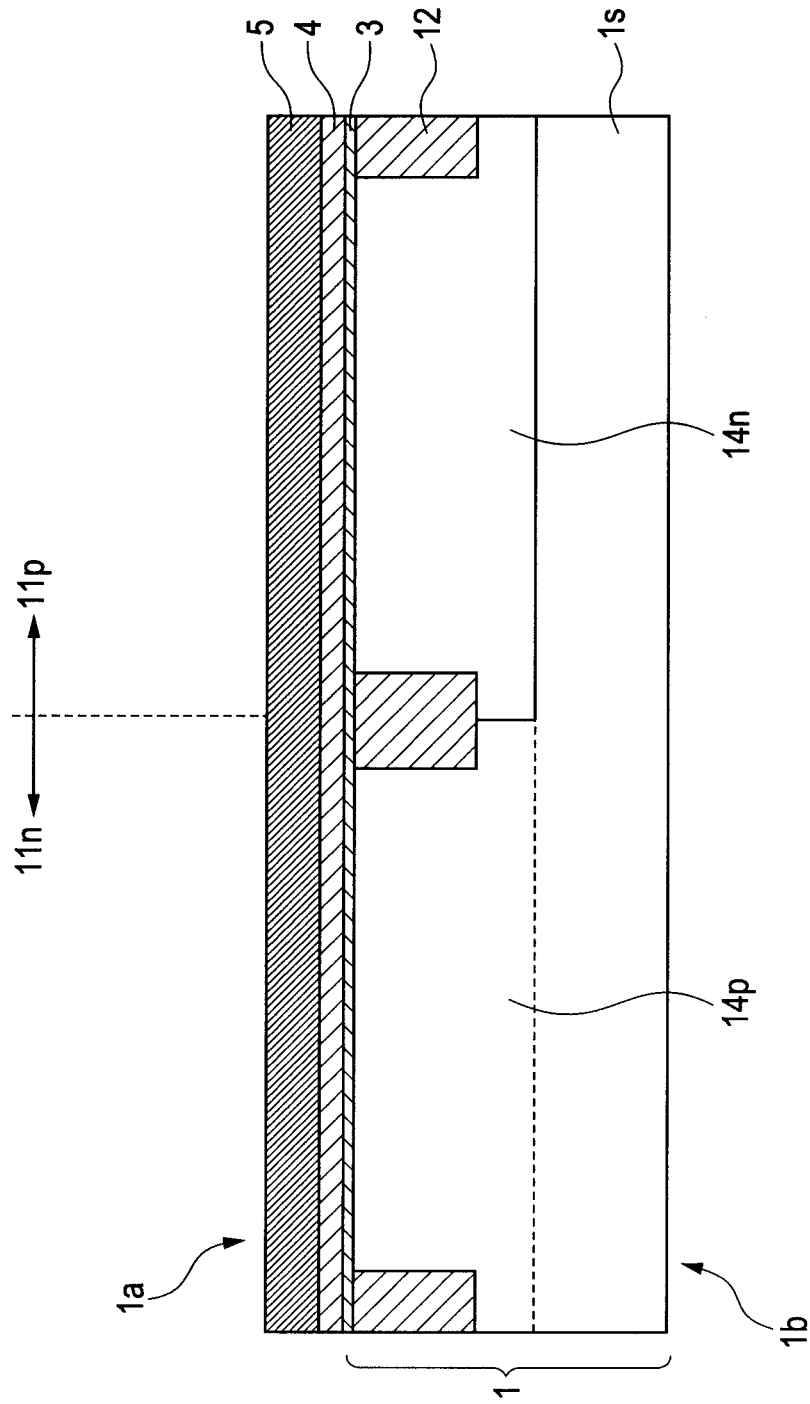
FIG. 19 is a sectional view of a device in a wafer process corresponding to a device structure (a double metal gate electrode type MISFET) of a semiconductor integrated circuit device according to Second Embodiment (basic example) of the present application (a step of forming a P-channel side capping film and others).
Figure 20:
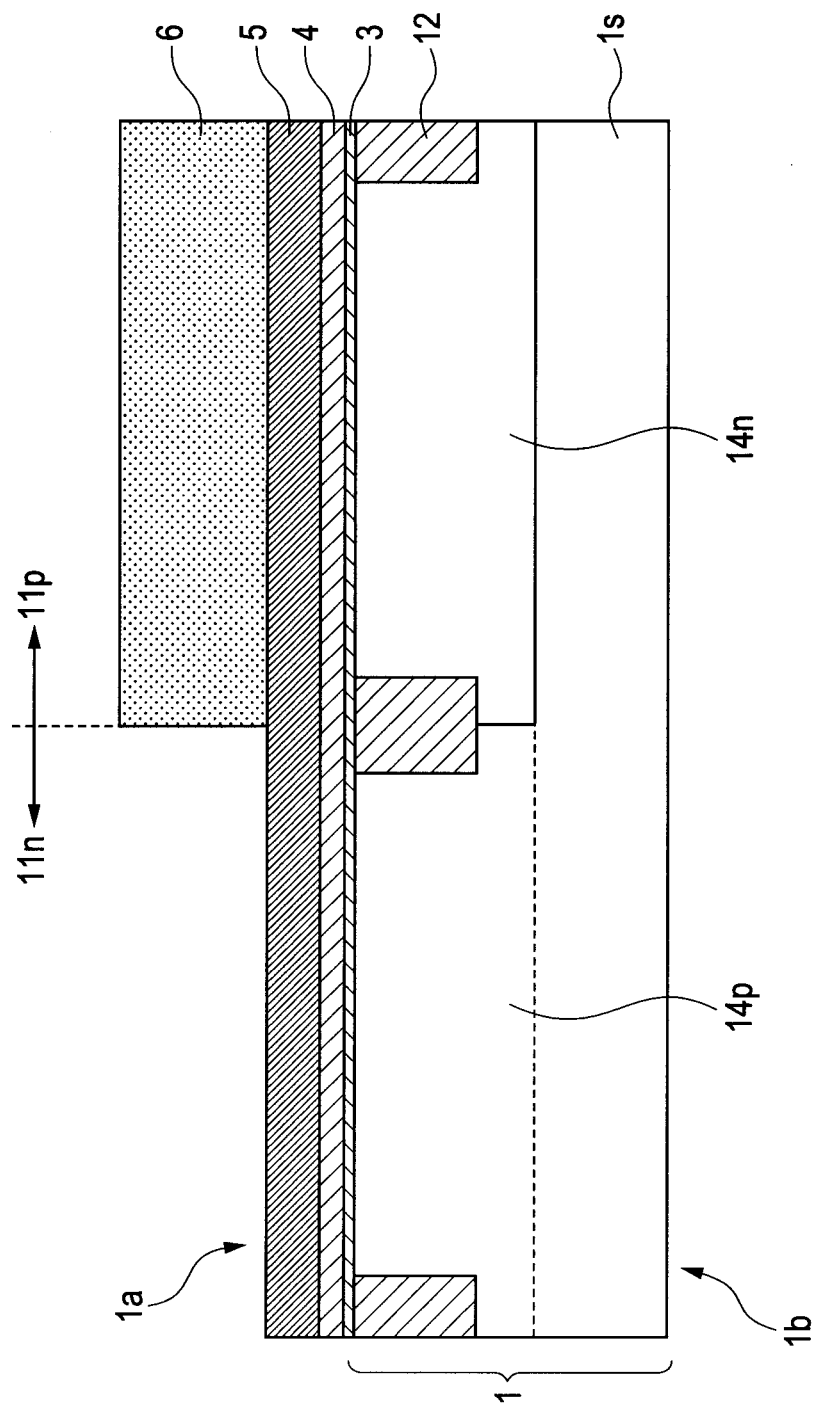
FIG. 20 is a sectional view of a device in, a wafer process corresponding to a device structure (a double metal gate electrode type MISFET) of a semiconductor integrated circuit device according to Second Embodiment (basic example) of the present application (a step of forming a resist pattern for patterning a P-channel side capping film and others).
Figure 21:
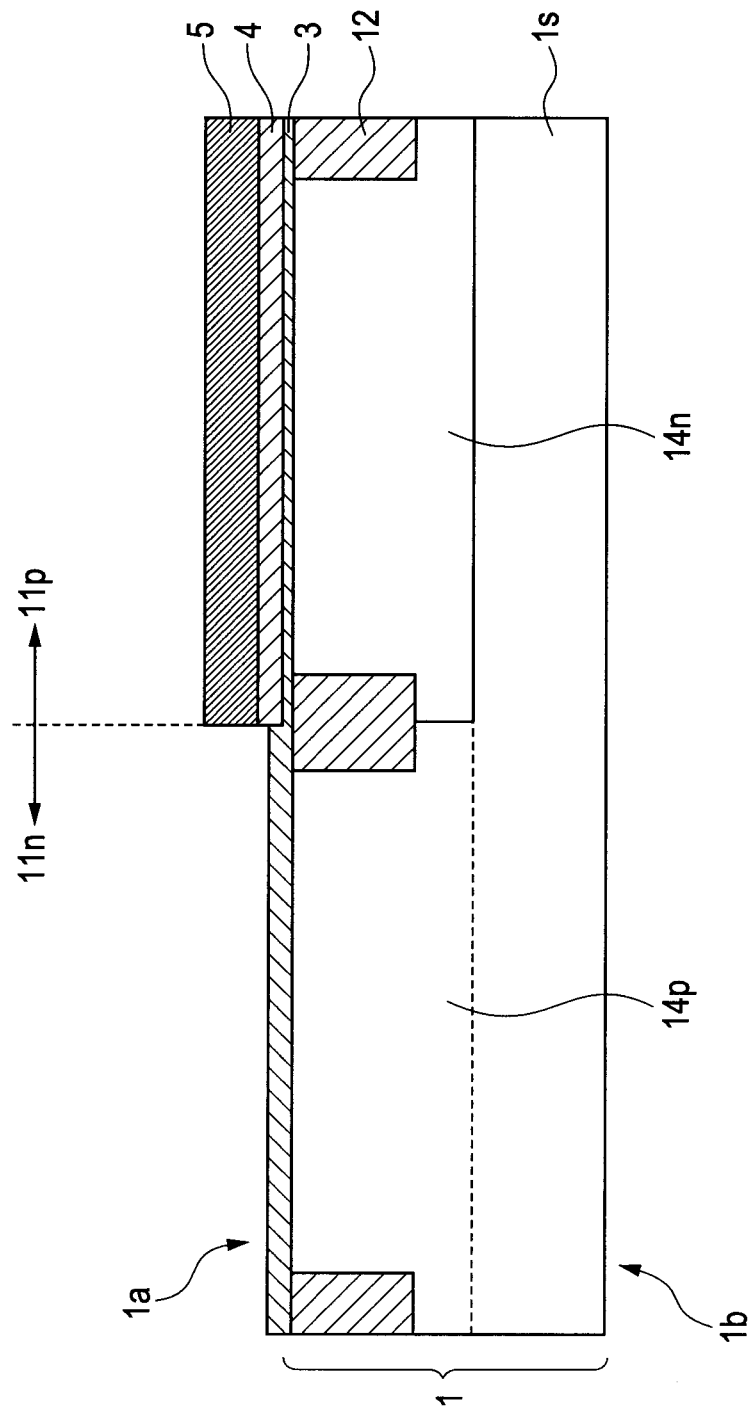
FIG. 21 is a sectional view of a device in a wafer process corresponding to a device structure (a double metal gate electrode type MISFET) of a semiconductor integrated circuit device according to Second Embodiment (basic example) of the present application (a step of patterning a P-channel side capping film and others).
Figure 22:
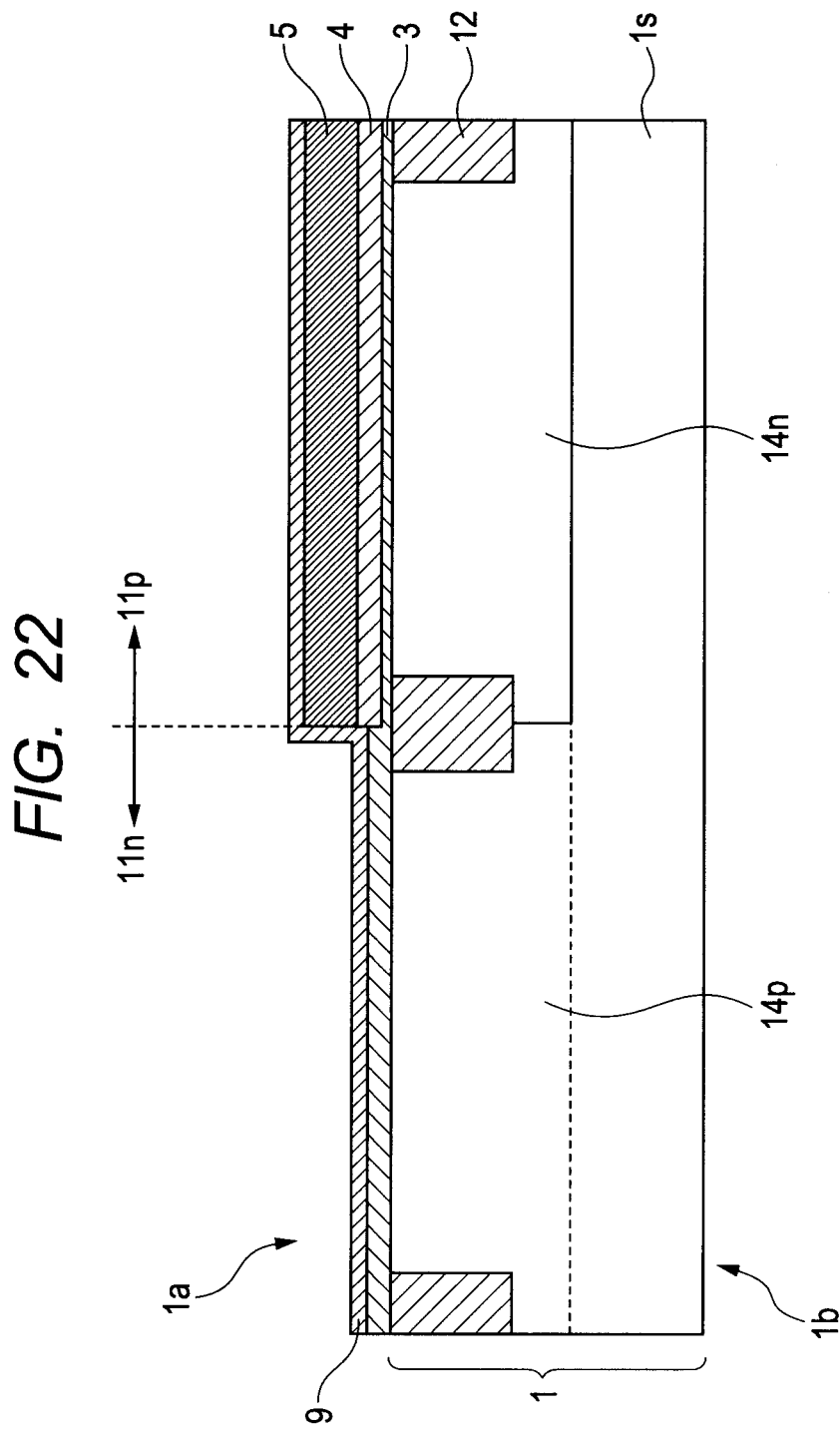
FIG. 22 is a sectional view of a device in a wafer process corresponding to a device structure (a double metal gate electrode type MISFET) of a semiconductor integrated circuit device according to Second Embodiment (basic example) of the present application (a step of forming an N-channel side capping film and annealing).
Figure 23:
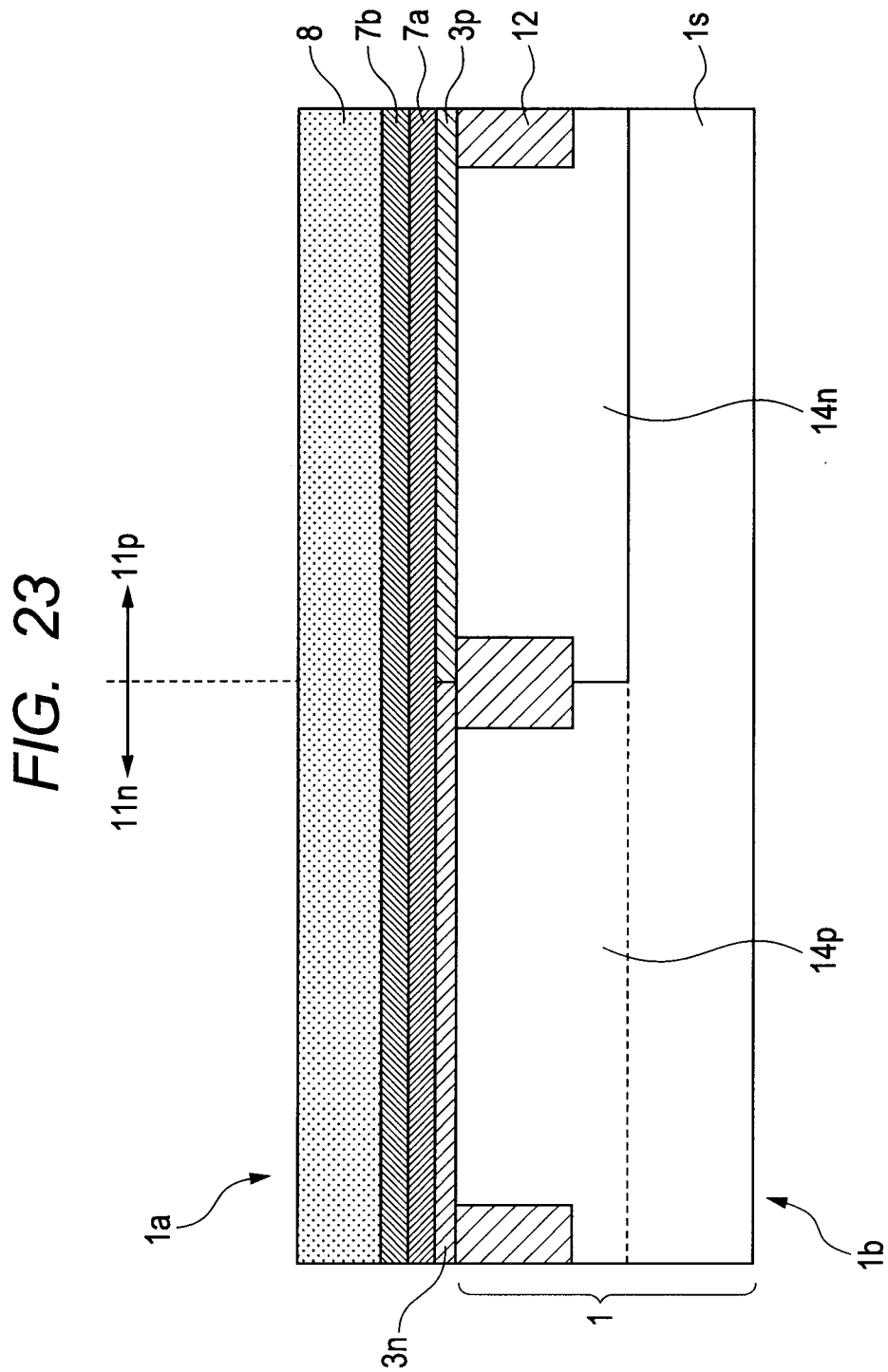
FIG. 23 is a sectional view of a device in a wafer process corresponding to a device structure (a double metal gate electrode type MISFET) of a semiconductor integrated circuit device according to Second Embodiment (basic example) of the present application (a step of forming a gate electrode film).
Figure 24:
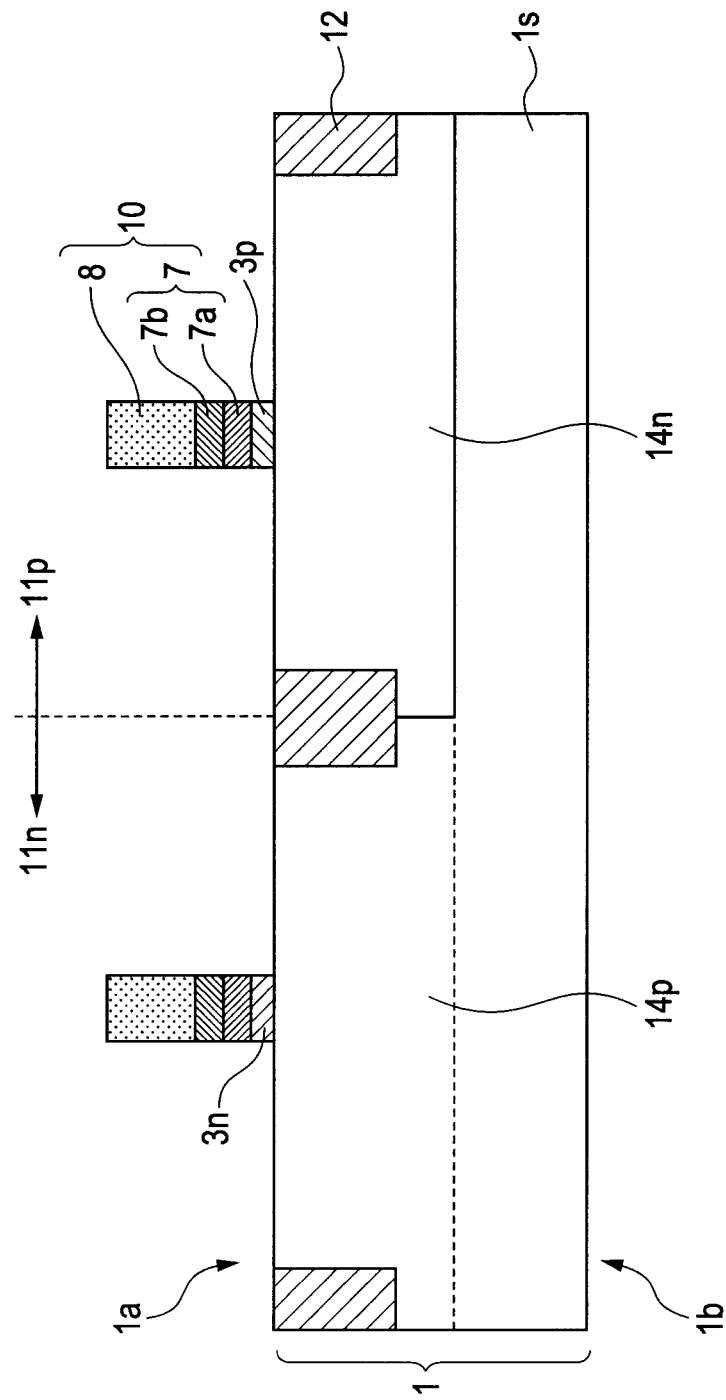
FIG. 24 is a sectional view of a device in a wafer process corresponding to a device structure (a double metal gate electrode type MISFET) of a semiconductor integrated circuit device according to Second Embodiment (basic example) of the present application (a step of patterning a gate electrode film).
Figure 25:
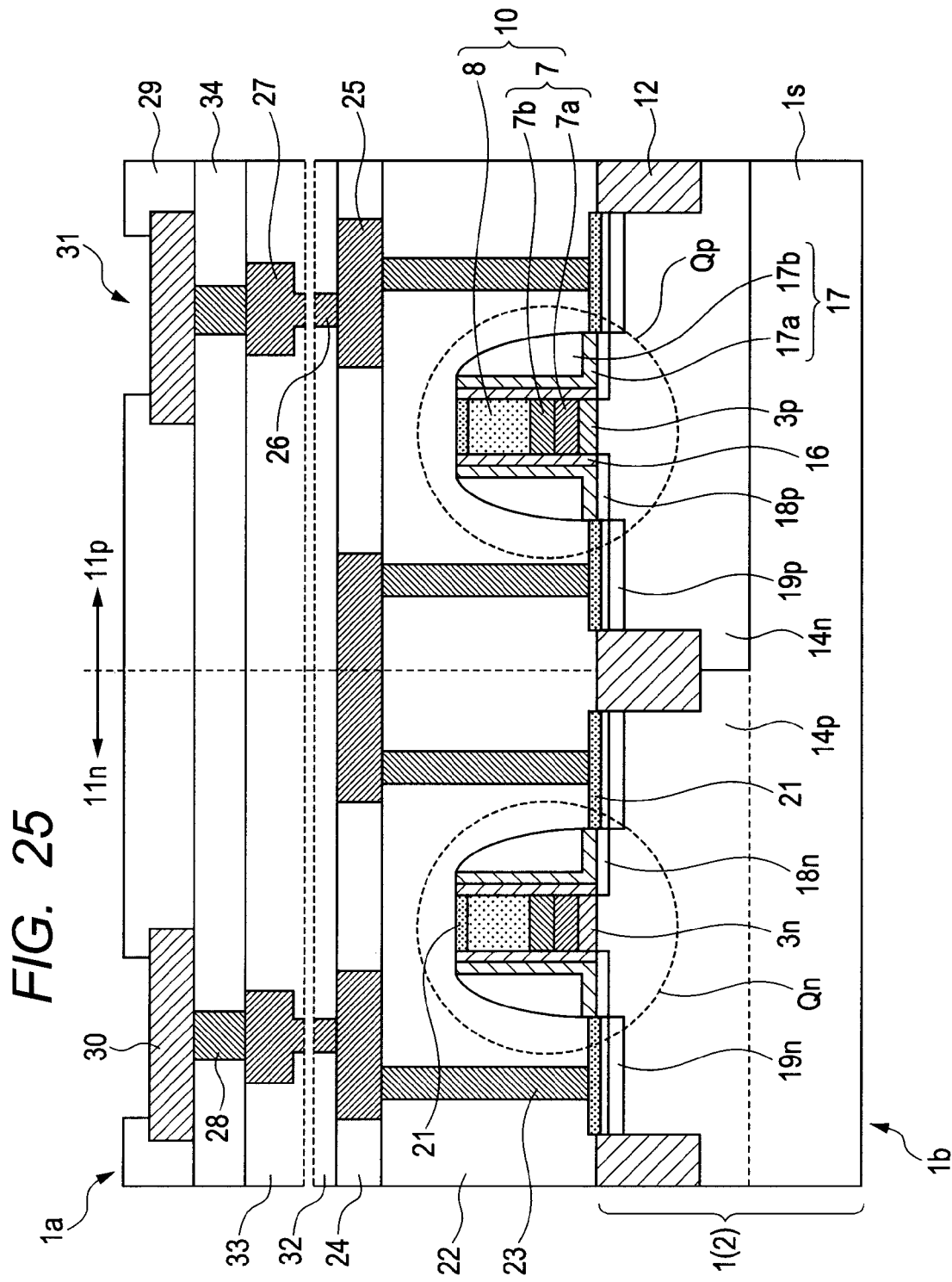
FIG. 25 is a sectional view of a device in a wafer process corresponding to a device structure (a double metal gate electrode type MISFET) of a semiconductor integrated circuit device according to Second Embodiment (basic example) of the present application (a step of wiring).

FIG. 19 is a sectional view of a device in a wafer process corresponding to a device structure (a double metal gate electrode type MISFET) of a semiconductor integrated circuit device according to Second Embodiment (basic example) of the present application (a step of forming a P-channel side capping film and others). FIG. 20 is a sectional view of a device in a wafer process corresponding to a device structure (a double metal gate electrode type MISFET) of a semiconductor integrated circuit device according to Second Embodiment (basic example) of the present application (a step of forming a resist pattern for patterning a P-channel side capping film and others). FIG. 21 is a sectional view of a device in a wafer process corresponding to a device structure (a double metal gate electrode type MISFET) of a semiconductor integrated circuit device according to Second Embodiment (basic example) of the present application (a step of patterning a P-channel side capping film and others). FIG. 22 is a sectional view of a device in a wafer process corresponding to a device structure (a double metal gate electrode type MISFET) of a semiconductor integrated circuit device according to Second Embodiment (basic example) of the present application (a step of forming an N-channel side capping film and annealing). FIG. 23 is a sectional view of a device in a wafer process corresponding to a device structure (a double metal gate electrode type MISFET) of a semiconductor integrated circuit device according to Second Embodiment (basic example) of the present application (a step of forming a gate electrode film). FIG. 24 is a sectional view of a device in a wafer process corresponding to a device structure (a double metal gate electrode type MISFET) of a semiconductor integrated circuit device according to Second Embodiment (basic example) of the present application (a step of patterning a gate electrode film). FIG. 25 is a sectional view of a device in a wafer process corresponding to a device structure (a double metal gate electrode type MISFET) of a semiconductor integrated circuit device according to Second Embodiment (basic example) of the present application (a step of wiring). On the basis of the figures, the device structures (a double metal gate electrode type MISFET) of a semiconductor integrated circuit device according to Second Embodiment (basic example) of the present application and the substantial processes thereof are explained.

In succession to the state shown in FIG. 1, as shown in FIG. 19, a high-k gate insulation film 3 (a high-permittivity insulation film), a P-channel side capping insulation film 4, a metal masking film 5 for example, and the like are formed in sequence over the nearly whole area of the top surface 1a of a semiconductor wafer 1.

Here, a preferred example of the high-permittivity insulation film 3 is a hafnium-oxide-based insulation film such as a hafnium oxide film (a hafnia film, namely $HfO_2$). A preferred example of conditions for forming the hafnium oxide film 3 is film thickness: about 1 nm for example, film forming method: ALD (Atomic Layer Deposition) for example, and gas type: $HfCl_4$, $H_2O$, or the like for example. Other examples of the high-permittivity insulation film 3 are: a zirconium-oxide-based insulation film; HfSiON; and oxide, oxynitride, and oxynitride silicide of Hf, La, Al, or the like.

A preferred example of the P-channel side capping insulation film 4 is an aluminum-oxide-based insulation film such as an aluminum oxide film (an alumina film). A preferred example of conditions for forming the aluminum oxide film 4 is film thickness: about 1 nm for example (as a range, 0.1 nm or more and 2 nm or less for example), film forming method: sputtering film forming for example, and gas type (gas atmosphere): argon or the like for example. Other examples of the P-channel side capping insulation film 4 are: an aluminum, Pt, Ir, Ni, or Ru film; an oxide film, a nitride film, a carbide film, a silicide film, a nitride silicide film, and a carbonitride film of each of those elements.

A preferred example of the metal masking film 5 is a titanium-based nitride film such as a titanium nitride film. A preferred example of conditions for forming the lower layer metal masking film 5 is film thickness: about 10 nm for example, film forming method: reactive sputtering film forming for example (CVD or the like may also be used), gas type (gas atmosphere): nitrogen for example (gas flow rate: about 10 sccm for example) or the like, treatment pressure: about 10 millipascal for example, treatment temperature: room temperature for example, and element composition ratio (Ti/N): about 0.85 for example (a preferred example of the range is from more than 0.84 to less than 0.87). Another example of the metal masking film 5 is a high-melting point metal nitride film such as TiAlN, TaN, TaNC, or the like.

Successively as shown in FIG. 20, a resist film 6 for removing the capping film and others (an ultraviolet resist film, an X-ray resist film, an electron beam resist film, or the like) is: applied for example over the nearly whole area of the top surface 1a of the semiconductor wafer 1; and patterned for example by ordinary lithography (ultraviolet lithography, X-ray lithography, electron beam lithography, or the like).

Successively as shown in FIG. 21, wet etching treatment is applied to the side of the top surface 1a of the semiconductor wafer 1 using the patterned resist film 6 for removing the capping film and others as a mask and thereby the P-channel side capping insulation film 4 and the metal masking film 5 in the N-channel MISFET region 11n are removed. After that, the no-longer-necessary resist film 6 for removing the capping film and others is removed.

Here, a preferred example of a chemical liquid used for the wet etching treatment is SPM (Sulfuric Acid Hydrogen Peroxide Mixture). Then another example of the chemical liquid is HPM (Hydrochloric Acid Hydrogen Peroxide Mixture) or the like.

Successively as shown in FIG. 22, an N-channel side capping insulation film 9 is formed over the nearly whole area of the top surface 1a of the semiconductor wafer 1. Subsequently, by applying annealing treatment (for example, RTA treatment at about 850° C.) to the top surface 1a of the semiconductor wafer 1, interdiffusion or the like of elements and the like between the capping films 4 and 9 and the like (including the metal masking film 5) and the high-permittivity insulation film 3 is advanced. By so doing, the high-permittivity insulation film 3 is modified: into an N-channel side gate insulation film 3n after the capping film is removed in the N-channel MISFET region 11n; and into a P-channel side gate insulation film 3p after the capping film is removed in the P-channel MISFET region 11p.

Here, a preferred example of the N-channel side capping insulation film 9 is a lanthanum-oxide-based insulation film. A preferred example of conditions for forming the lanthanum oxide film 9 is film thickness: about 1 nm for example (as a range, 0.5 nm or more and 2 nm or less for example), film forming method: sputtering film forming for example, and gas type (atmospheric gas): argon gas or the like for example. Another example of the N-channel side capping insulation film 9 is: an La, Hf, Ta, Mg, Yb, or In film; or a film containing oxide, nitride, carbide, silicide, nitride silicide, carbonitride, or the like of each of those elements.

Successively after the state shown in FIG. 6, as shown in FIG. 23, over the high-permittivity gate insulation film (the N-channel side gate insulation film 3n and the P-channel side gate insulation film 3p), a composite gate electrode film 10 including a lower layer metal gate electrode film 7a, an upper layer metal gate electrode film 7b, a polysilicon gate electrode film 8 (including amorphous silicon), and the like in sequence is formed. Here, the lower layer metal gate electrode film 7a and the upper layer metal gate electrode film 7b configure a metal gate electrode film 7.

Here, a preferred example of the metal gate electrode film 7 is a titanium-based nitride film such as a titanium nitride film. A preferred example of conditions for forming the lower layer metal gate electrode film 7a is film thickness: about 5 nm for example, film forming method: reactive sputtering film forming for example (CVD or the like may also be used), gas type (gas atmosphere): nitrogen for example (gas flow rate: about 3 sccm for example) or the like, treatment pressure: about 10 millipascal for example, treatment temperature: room temperature for example, and element composition ratio (Ti/N): about 0.88 for example (as a preferred range, 0.87 or more and 0.9 or less for example). A preferred example of conditions for forming the upper layer metal gate electrode film 7b is film thickness: about 5 nm for example, film forming method: reactive sputtering film forming for example (CVD or the like may also be used), gas type (gas atmosphere): nitrogen for example (gas flow rate: about 12 sccm for example) or the like, treatment pressure: about 10 millipascal for example, treatment temperature: room temperature for example, and element composition ratio (Ti/N): about 0.81 for example (as a preferred range, 0.77 or more and 0.84 or less for example). That is, the upper layer metal gate electrode film 7b contains nitrogen more abundantly than the lower layer metal gate electrode film 7a. Another example of the metal gate electrode film 7 is a high-melting point metal nitride film or the like such as TiAlN, TaN, or TaNC.

A preferred example of conditions for forming the polysilicon gate electrode film 8 is film thickness: about 50 nm for example (as a range, 30 nm or more and 120 nm or less for example), and film forming method: LP-CVD (Low Pressure-CVD) for example.

Successively after the state similar to the state shown in FIG. 8, as shown in FIG. 24, the high-permittivity gate insulation film (the N-channel side gate insulation film 3n and the P-channel side gate insulation film 3p) and the composite gate electrode film 10 are patterned by anisotropic dry etching while a patterned resist film 15 for processing a gate electrode is used as a mask. After that, the no-longer-necessary resist film 15 for processing a gate electrode (FIG. 8) is removed.

Successively after the states similar to the states shown in FIGS. 10 to 17, as shown in FIG. 25 (corresponding to FIG. 18 at the section 1), a first layer interlayer insulation film 24 (including a silicon-oxide-based insulation film such as an SiOC film and accompanying a copper-diffused barrier insulation film such as SiCN at boundaries for example, the same is applied to interlayer insulation films to be described below) is formed over the pre-metal insulation film 22 and a first layer embedded wiring 25 (a copper-based wiring by a single damascene method for example) is formed there. Subsequently, a second layer interlayer insulation film 32 is formed over the first layer interlayer insulation film 24 and a second layer embedded wiring 26 (a copper-based wiring by a dual damascene method for example) is formed there. By repeating the processes in sequence, an N-th layer embedded wiring 27 is formed in an N-th layer interlayer insulation film 33. Subsequently, an under-pad interlayer insulation film 34 (a silicon-oxide-based insulation film for example) is formed over the N-th layer interlayer insulation film 33 and under-pad tungsten plugs 28 are embedded therein. Subsequently, aluminum-based bonding pads 30 are formed over the under-pad interlayer insulation film 34. Subsequently, a final passivation film 29 (including a silicon-oxide-based insulation film, a silicon-nitride-based insulation film, or the like and sometimes accompanying an organic insulation film such as a polyimide film in the upper layer for example) is formed in the manner of covering the under-pad interlayer insulation film 34 and the aluminum-based bonding pads 30. Subsequently, pad openings 31 are formed in the final passivation film 29. Thereafter, the wafer 1 is divided into individual semiconductor chips 2 by dicing (a blade dicing method, a laser dicing method, or a pelletizing method combining both the methods) or the like.

Through the above processes, an integrated circuit device incorporating an N-channel MISFET (Qn) and a P-channel MISFET (Qp) is almost completed.

Here, the difference from FIG. 18 is that the metal gate electrode film 7 includes the lower layer metal gate electrode film 7a and the upper layer metal gate electrode film 7b.

3. Explanations of substantial processes, device structures, and the like in a manufacturing method (a double metal masking method double metal gate electrode type MISFET) of a semiconductor integrated circuit device according to First Embodiment (Modified Example 1) of the present application (refer mainly to FIGS. 1 to 6 and 23 to 25)

This embodiment is the case where the metal masking film 5 (having a double structure, in particular) is applied to the metal gate electrode film 7 in the section 1, thus the process flow itself is nearly identical, and hence only different points are explained hereunder in principle.

Referring mainly to FIGS. 1 to 6 and 23 to 25, substantial processes, device structures, and the like in a manufacturing method (a double metal masking method double metal gate electrode type MISFET) of a semiconductor integrated circuit device according to First Embodiment (Modified Example 1) of the present application are explained.

The former half of the wafer process, namely from FIG. 1 to FIG. 6, is identical to the section 1. Then the latter half of the wafer process, namely from FIG. 23 to FIG. 25, is identical to the section 2. Consequently, the device structure is identical to that shown in FIG. 25.

4. A manufacturing method and others of a semiconductor integrated circuit device according to First Embodiment (Modified Example 2) and a device structure and others of a semiconductor integrated circuit device according to Second Embodiment (Modified Example) of the present application (mainly FIG. 26)

This section shows various examples of an element composition ratio (Ti/N) distribution suitable for a metal masking film 5 (a lower layer metal masking film 5a and an upper layer metal masking film 5b) and a metal gate electrode film 7 (a lower layer metal gate electrode film 7a and an upper layer metal gate electrode film 7b) having a double structure (including a multiple structure and a continuously tapered distribution structure) explained in the sections 1 to 3.

Figure 26:
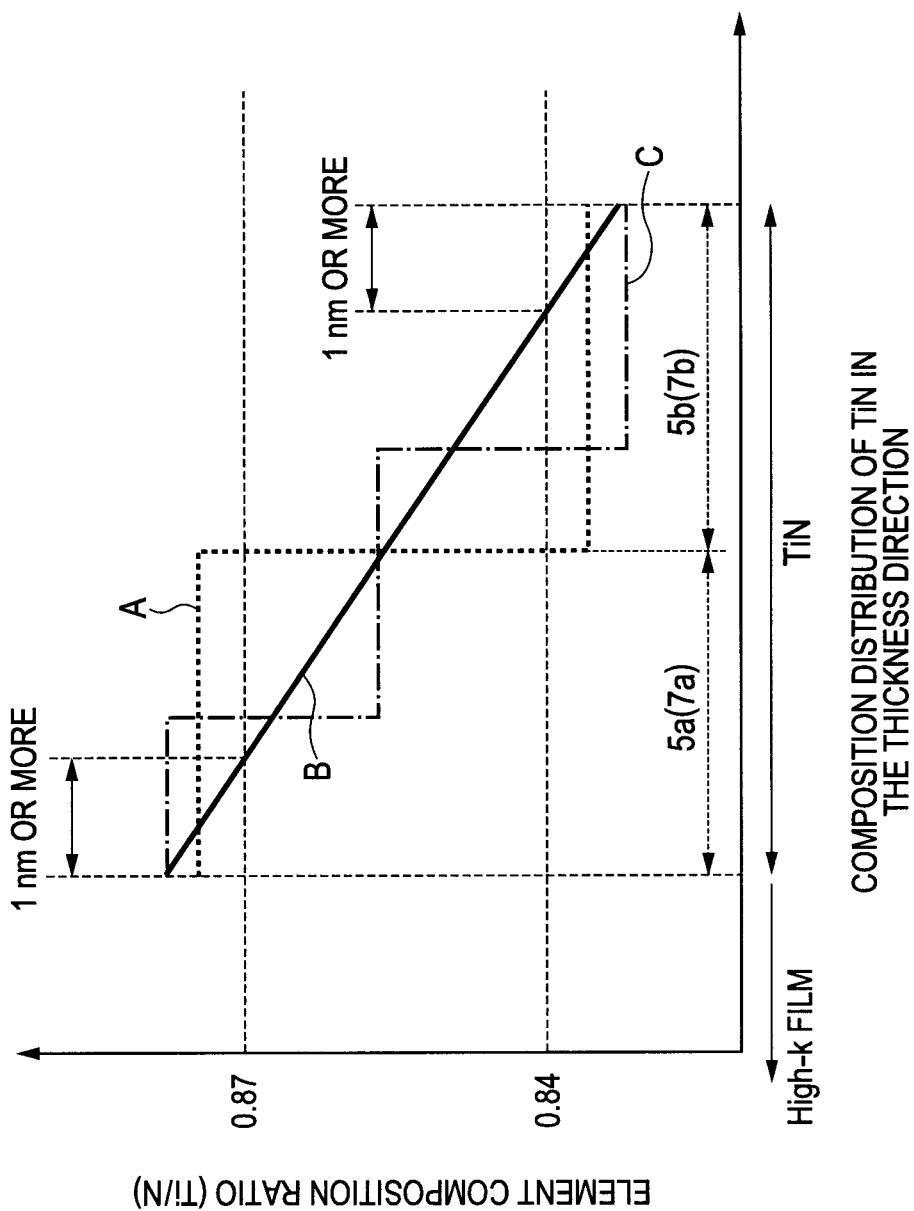
FIG. 26 is a graph showing the distribution of element composition ratios in the thickness direction of titanium nitride films in the respective embodiments.

FIG. 26 is a graph showing the distribution of element composition ratios in the thickness direction of titanium nitride films in the respective embodiments. On the basis of the figure, a manufacturing method and others of a semiconductor integrated circuit device according to First Embodiment (Modified Example 2) and a device structure and others of a semiconductor integrated circuit device according to Second Embodiment (Modified Example) of the present application are explained.

As shown in FIG. 26, various modified examples are conceivable with regard to the distribution of an element composition ratio (Ti/N) in a metal masking film 5 (or a metal gate electrode film 7) in the thickness direction. (1) basic distribution: the case explained at the sections 1, 2, and 3 is based on the two-step element composition ratio distribution A shown in FIG. 26 and usually such a distribution is obtained by changing a nitrogen flow rate once (twice in the case of a three-step) in the middle of a film forming step on an identical wafer stage in an identical sputtering film forming furnace, that is, obtained through in-situ treatment (the same is applied hereunder).

Further, not only a step-shaped distribution but also a continuously tapered element composition ratio distribution B can be applied. Needless to say, not only a straight-shaped distribution but also a curve-shaped distribution may be applied. Here, in order to obtain good properties, it is necessary that the thickness of each of the regions in predetermined ranges at both the ends, namely the thickness of each of the regions of a lower layer metal masking film 5a and an upper layer metal masking film 5b (or a lower layer metal gate electrode film 7a and an upper layer metal gate electrode film 7b), is at least 1 nm or more. This case can be obtained by continuously changing a nitrogen flow rate during a film forming step.

Further, the step-shaped distribution is not limited to the two-step element composition ratio distribution A but may also be a multistep element composition ratio distribution such as a three-step element composition ratio distribution C. In this case too, in order to obtain good properties, it is necessary that the thickness of each of the regions in predetermined ranges at both the ends, namely the thickness of each of the regions of a lower layer metal masking film 5a and an upper layer metal masking film 5b (or a lower layer metal gate electrode film 7a and an upper layer metal gate electrode film 7b), is at least 1 nm or more.

5. Consideration and supplemental explanations on the embodiments and the like of the present application The element composition ratio (Ti/N) of a titanium-nitride-based metal masking film (or a titanium-nitride-based metal gate electrode film) used in each of the embodiment is classified nearly into the following ranges. That is, the regions are a titanium rich region: 0.87 or more and 0.9 or less (a lower layer metal masking film 5a, a lower layer metal gate electrode film 7a), a standard intermediate region: more than 0.84 and less than 0.87 (a metal masking film 5, a metal gate electrode film 7), a nitrogen rich region: 0.77 or more and 0.84 or less (an upper layer metal masking film 5b, an upper layer metal gate electrode film 7b), and a nitrogen rich intermediate region: more than 0.77 and less than 0.87 (a metal gate electrode film 7). The standard intermediate region represents a standard composition of a film that is usually regarded as a TiN film in reactive sputtering film forming.

1) Double Layer Sacrificial Metal Masking Method (the Section 1, FIG. 2)

As explained in the section 1, in this case, a metal masking film 5 includes a lower layer TiN film 5a of a comparatively titanium rich region and an upper layer TiN film 5b of a nitrogen richer region and hence it is possible to increase the quantity of titanium supplied to a high-permittivity insulation film 3 (it is possible to reduce the supply of nitrogen at the same time) while inhibiting the oxidation of the TiN film 5 and the like (this is because the selectivity with a high-k gate insulation film in succeeding wet etching deteriorates when the surface of the TiN film 5 is oxidized). By so doing it is possible to effectively raise a PMOS work function and as a result it is possible to lower the threshold voltage of a P-channel MISFET (Qp) to an appropriate range. Usually a single layer metal gate electrode film 7 has an element composition ratio of the standard intermediate region that is already proven in a process but in this case, since the adverse effect of nitrogen rich is comparatively small, it is also possible to take an element composition ratio of the nitrogen rich intermediate region if necessary.

Meanwhile, a single layer metal gate electrode film 7 having an element composition ratio of the titanium rich region should not be applied unless particularly needed in order to avoid the problem of the generation of titanium silicide caused by reaction with a polysilicon gate electrode 8 of the upper layer.

(2) Double layer metal gate electrode method (the section 2, FIGS. 19 and 23)

As explained in the section 2, in this case, a metal gate electrode film 7 includes a lower layer TiN film 7a of a comparatively titanium rich region and an upper layer TiN film 7b of a nitrogen richer region and hence it is possible to increase the quantity of titanium supplied to a high-permittivity insulation film 3 (it is possible to reduce the supply of nitrogen at the same time) while inhibiting the oxidation of the TiN gate electrode film 7 and the like. In this case, unlike the case of the section 1, the double layer metal gate electrode film 7 is influenced by heat treatment for activating source drain and hence it is possible to effectively control the supply of titanium to the high-permittivity insulation film 3 and the like.

In this case, as the single layer metal masking film 5 (TiN film), usually the standard intermediate region is preferably adopted from the viewpoint of preventing oxidation and increase of nitrogen diffusion.

(3) Double layer sacrificial metal masking & double layer metal gate electrode method (the section 3, FIGS. 2 and 23)

As explained in the section 3, in this case, a metal masking film 5 includes a lower layer TiN film 5a of a comparatively titanium rich region and an upper layer TiN film 5b of a nitrogen richer region and also a metal gate electrode film 7 includes a lower layer TiN film 7a of a comparatively titanium rich region and an upper layer TiN film 7b of a nitrogen richer region and hence it is possible to obtain the advantages of both the methods. In contrast, the step becomes more complex.

6. Summary

Although the invention established by the present inventors has been specifically explained on the basis of embodiments, it is obvious that the present invention is not limited to the embodiments and various changes may be made without departing from the scope of the invention.

For example, although concrete explanations have been done mainly on the basis of a copper-based embedded wiring as a wiring layer in the above embodiments, it is obvious that the present invention is not limited to the embodiments and can be applied to an integrated circuit or the like that uses a silver-based embedded wiring or an aluminum-based non-embedded wiring.

What is claimed is:

1. A method for manufacturing a semiconductor integrated circuit device comprising the steps of:
   (a) forming a high-permittivity insulation film in an N-channel region and a P-channel region over a first main surface of a semiconductor wafer;
   (b) forming a P-channel capping film over the high-permittivity insulation film;
   (c) forming a high-melting point metal nitride masking film over the P-channel capping film;
   (d) removing the P-channel capping film and the high-melting point metal nitride masking film in the N-channel region;
   (e) covering the N-channel region and the P-channel region with an N-channel capping film after the step (d);
   (f) applying annealing treatment to the side of the first main surface of the semiconductor wafer after the step (e);
   (g) removing the high-melting point metal nitride masking film, the N-channel capping film, and the P-channel capping film after the step (f);
   (h) forming a gate electrode film over the high-permittivity insulation film after the step (g); and
   (i) forming a gate electrode in each of the N-channel region and the P-channel region by patterning the gate electrode film,
   wherein the high-melting point metal nitride masking film includes:
   (x1) a lower layer high-melting point metal nitride masking film having a first element composition ratio; and
   (x2) an upper layer high-melting point metal nitride masking film having a second element composition ratio in which nitrogen is richer than in the first element composition ratio and being formed over the lower layer high-melting point metal nitride masking film.

2. A method for manufacturing a semiconductor integrated circuit device according to claim 1, wherein the high-melting point metal nitride masking film has a titanium-based nitride film as the main constituent component.

3. A method for manufacturing a semiconductor integrated circuit device according to claim 2, wherein the high-permittivity insulation film has a hafnium-oxide-based insulation film as the main constituent component.

4. A method for manufacturing a semiconductor integrated circuit device according to claim 3, wherein the P-channel capping film has an aluminum-based film as the main constituent component.

5. A method for manufacturing a semiconductor integrated circuit device according to claim 4, wherein the N-channel capping film has a lanthanum-oxide-based insulation film as the main constituent component.

6. A method for manufacturing a semiconductor integrated circuit device according to claim 5, wherein, through the step (f): the hafnium-oxide-based insulation film is modified to a film containing lanthanum in the N-channel region; and the hafnium-oxide-based insulation film is modified to a film containing aluminum and titanium in the P-channel region.

7. A method for manufacturing a semiconductor integrated circuit device according to claim 6,
wherein the lower layer high-melting point metal nitride masking film and the upper layer high-melting point metal nitride masking film are a titanium nitride film, and (1) the first element composition ratio (Ti/N) is 0.87 or more and 0.9 or less and (2) the second element composition ratio (Ti/N) is 0.77 or more and 0.84 or less.

8. A method for manufacturing a semiconductor integrated circuit device according to claim 7,
wherein the gate electrode film has:
(y1) a metal gate electrode film having a titanium-based nitride film as the main constituent component; and
(y2) a polysilicon gate electrode film having a polysilicon film formed over the metal gate electrode film as the main constituent component.

9. A method for manufacturing a semiconductor integrated circuit device according to claim 8, wherein the metal gate electrode film is a titanium nitride film and the element composition ratio (Ti/N) thereof is smaller than the first element composition ratio (Ti/N).

10. A method for manufacturing a semiconductor integrated circuit device according to claim 8, wherein the metal gate electrode film is a titanium nitride film and the element composition ratio (Ti/N) of the metal gate electrode film is smaller than the first element composition ratio (Ti/N) and larger than the second element composition ratio (Ti/N).

11. A method for manufacturing a semiconductor integrated circuit device according to claim 10, wherein the element composition ratio (Ti/N) of the metal gate electrode film is larger than 0.84 and smaller than 0.87.

12. A method for manufacturing a semiconductor integrated circuit device according to claim 8, wherein the metal gate electrode film has:
(y11) a lower layer metal gate electrode film; and
(y12) an upper layer metal gate electrode film being formed over the lower layer metal gate electrode film and containing nitrogen more abundantly than the lower layer metal gate electrode film.

13. A method for manufacturing a semiconductor integrated circuit device according to claim 1, wherein the step (c) is carried out by in-situ treatment.

14. A method for manufacturing a semiconductor integrated circuit device according to claim 13, wherein the P-channel capping film and the high-melting point metal nitride masking film are removed by wet treatment in the step (d).

15. A method for manufacturing a semiconductor integrated circuit device according to claim 14, wherein the P-channel capping film and the high-melting point metal nitride masking film are removed by wet treatment in the step (g).

16. A method for manufacturing a semiconductor integrated circuit device according to claim 15, wherein the wet treatment is applied with an HPM based etching liquid or an SPM based etching liquid.

* * * * *